(12) United States Patent
Kim et al.

(10) Patent No.: US 11,714,504 B2
(45) Date of Patent: Aug. 1, 2023

(54) DISPLAY DEVICE

(71) Applicant: LG Display Co., Ltd., Seoul (KR)

(72) Inventors: CheolSe Kim, Seoul (KR); JuHan Kim, Bucheon-si (KR); Jinseong Kim, Gimpo-si (KR); Haewon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/561,270

(22) Filed: Dec. 23, 2021

(65) Prior Publication Data

US 2022/0206619 A1 Jun. 30, 2022

(30) Foreign Application Priority Data

Dec. 31, 2020 (KR) .................. 10-2020-0189510

(51) Int. Cl.
*G06F 3/041* (2006.01)
*G06F 3/044* (2006.01)

(52) U.S. Cl.
CPC ............ *G06F 3/0412* (2013.01); *G06F 3/044* (2013.01); *G06F 3/04164* (2019.05); *G06F 3/04166* (2019.05); *G06F 2203/04111* (2013.01)

(58) Field of Classification Search
CPC ............... G06F 3/0412; G06F 3/04166; G06F 3/04164; G06F 3/044; G06F 2203/04111
See application file for complete search history.

(56) References Cited

U.S. PATENT DOCUMENTS

| | | |
|---|---|---|
| 9,785,283 B2 | 10/2017 | Noguchi et al. |
| 9,952,724 B2 | 4/2018 | Akimoto et al. |
| 10,101,867 B2 | 10/2018 | Akimoto et al. |
| 11,322,565 B2 | 5/2022 | Jeon et al. |
| 2011/0298746 A1 | 12/2011 | Hotelling |
| 2017/0075452 A1 | 3/2017 | Kim et al. |
| 2017/0371213 A1 | 12/2017 | Wang et al. |
| 2018/0088716 A1 | 3/2018 | Kim |

(Continued)

FOREIGN PATENT DOCUMENTS

| | | |
|---|---|---|
| CN | 111799320 A | 10/2020 |
| EP | 1576640 A1 | 9/2005 |
| EP | 3605208 A1 | 2/2020 |

(Continued)

OTHER PUBLICATIONS

Jeon et al., Google Machine Translation of "Touch panel and stretchable display comprising the same" (Year: 2020).*

(Continued)

*Primary Examiner* — Peter D Mcloone
(74) *Attorney, Agent, or Firm* — Seed IP Law Group LLP

(57) ABSTRACT

A display device includes a first substrate, pixel substrates, first connection lines, second connection lines, and a touch electrode. The pixel substrates are disposed on the first substrate, and are spaced apart from each other along a first direction and along a second direction perpendicular to the first direction. The first connection lines connect pixel substrates disposed along the first direction. The second connection lines connect pixel substrates disposed along the second direction. The touch electrode is disposed between the pixel substrates in an area adjacent to areas in which the first connection lines and the second connection lines are disposed.

19 Claims, 14 Drawing Sheets

(56) References Cited

U.S. PATENT DOCUMENTS

2019/0278455 A1* 9/2019 Li ...................... G06F 3/04166
2020/0194370 A1* 6/2020 Radauscher .......... H01L 23/528

FOREIGN PATENT DOCUMENTS

| | | |
|---|---|---|
| EP | 3675178 A1 | 7/2020 |
| JP | 2014021845 A | 2/2014 |
| JP | 2015228014 A | 12/2015 |
| JP | 2020106832 A | 7/2020 |
| KR | 10-2015-0091248 A | 8/2015 |
| KR | 10-2016-0046965 A | 5/2016 |
| KR | 10-2020-0079856 A | 7/2020 |
| KR | 1020200079856 A | 7/2020 |
| TW | 201918850 A | 5/2019 |

OTHER PUBLICATIONS

"Single-Zone 3D Gesture Controller Data Sheet," MGC3130, Microchip Technology Inc., DS41667A, 2012. (20 pages).

* cited by examiner

DISPLAY DEVICE

CROSS-REFERENCE TO RELATED APPLICATIONS

This application claims the priority to Korean Patent Application No. 10-2020-0189510 filed on Dec. 31, 2020 in the Republic of Korea.

BACKGROUND

Technical Field

The present disclosure relates to a display device, and more particularly, to an in-cell touch type of stretchable display device.

Discussion of the Related Art

Display devices used for a computer monitor, a TV, a mobile phone, and the like include an organic light emitting display (OLED) that emits light by itself, a liquid crystal display (LCD) that requires a separate light source, and the like.

Such display devices are being applied to more and more various fields including not only a computer monitor and a TV, but personal mobile devices, and thus, display devices having a reduced volume and weight while having a wide display area are being studied.

Recently, a display device manufactured to be stretchable in a specific direction and changeable into various shapes by forming a display unit, lines, and the like on a flexible substrate such as plastic that is a flexible material has received considerable attention as a next-generation display device.

BRIEF SUMMARY

A technical feature of the present disclosure is to provide a display device in which a touch system is embedded by arranging touch elements on a first or lower substrate.

A technical feature of the present disclosure is to provide a display device capable of simplifying a process and reducing a manufacturing cost by forming touch elements simultaneously when forming the elements on a first or lower substrate.

Technical features of the present disclosure are not limited to the above-mentioned features, and other features, which are not mentioned above, can be clearly understood by those skilled in the art from the following descriptions.

At least one of the technical features is achieved by the independent claims. Some embodiments are specified in the dependent claims.

A display device according to an embodiment of the present disclosure may include: a lower or first substrate; a plurality of pixel substrates disposed on the lower or first substrate to be spaced apart from each other along a first direction and a second direction non-parallel, preferably perpendicular, to the first direction; first connection lines disposed between first pixel substrates of the plurality of pixel substrates disposed along the first direction; second connection lines disposed between second pixel substrates of the plurality of pixel substrates disposed along the second direction; and a touch electrode disposed in an area adjacent to areas in which the first connection lines and the second connection lines are disposed among spaces between the plurality of pixel substrates.

A display device according to another embodiment of the present disclosure may include a first substrate; a plurality of pixel substrates disposed on the first substrate to be spaced apart from each other along a first direction and a second direction non-parallel, such as perpendicular, to the first direction; at least one first connection line disposed between and/or connecting pixel substrates among the plurality of pixel substrates disposed along the first direction; at least one second connection line disposed between and/or connecting pixel substrates among the plurality of pixel substrates disposed along the second direction; and a touch electrode disposed between the plurality of pixel substrates in an area adjacent to areas in which the first connection line and the second connection line are disposed.

A display device according to another embodiment of the present disclosure may include a first substrate; a plurality of first connection lines extending in a first direction and a plurality of second connection lines extending in a second direction, the first and second connection lines crossing each other, a plurality of pixel substrates disposed on the first substrate at crossings of the first and second connection lines, and a plurality of touch electrodes respectively disposed between adjacent first connection lines and adjacent second connection lines and between the pixel substrates.

A display device according to another embodiment of the present disclosure may include a lower or first substrate; a plurality of pixel substrates disposed in a matrix form on the lower or first substrate; a plurality of first connection lines connecting first pixel substrates among the plurality of pixel substrates, the first pixel substrates being arranged in a first direction; and a plurality of second connection lines for connecting second pixel substrates among the plurality of pixel substrates, the second pixel substrates being arranged in a second direction, wherein a scan signal is sequentially applied to each of the plurality of first connection lines in a display period, wherein a touch driving signal is sequentially applied to a group of the plurality of first connection lines in a touch period, wherein the touch driving signal is a signal obtained by a sum of a plurality of scan signals.

The display device according to any of the embodiments of the present disclosure may include one or more of the following features:

The touch electrode may be exposed by the pixel substrates and/or by the first and/or second connection lines. That is, the touch electrode may not be overlapped by the pixel substrates and/or by the first and/or second connection lines.

The first substrate may also be called lower substrate. The first substrate may be a flat and/or even substrate.

The touch electrode may be disposed in the area adjacent to areas in which the first connection lines and the second connection lines are disposed between the plurality of pixel substrates.

The touch electrode may be disposed in the area adjacent to areas in which the first connection lines and the second connection lines are disposed among spaces between the plurality of pixel substrates.

The first connection lines may connect pixel substrates disposed along the first direction. Additionally or alternatively, the second connection lines may connect pixel substrates disposed along the second direction.

The touch electrode may be disposed between two adjacent first connection lines. Additionally or alternatively, the touch electrode may be disposed between two adjacent second connection lines.

The plurality of pixel substrates may include a first pixel substrate, a second pixel substrate, a third pixel substrate and a fourth pixel substrate.

The first pixel substrate and the second pixel substrate may be adjacent to each other in the first direction and/or spaced from each other in the first direction. The second pixel substrate and the third pixel substrate may be adjacent to each other in the second direction and/or spaced from each other in the second direction. The third pixel substrate and the fourth pixel substrate may be adjacent to each other in the first direction and/or spaced from each other in the first direction. The fourth pixel substrate and the first pixel substrate may be adjacent to each other in the second direction and/or spaced from each other in the second direction.

A space or an area may be present between the first pixel substrate, the second pixel substrate, the third pixel substrate and the fourth pixel substrate. The touch electrode may be disposed in the space or the area bordered by the pixel substrates.

The touch electrode may be disposed between the first pixel substrate, the second pixel substrate, the third pixel substrate and the fourth pixel substrate.

The first pixel substrate and the second pixel substrate may be flush or aligned in the first direction. The second pixel substrate and the third pixel substrate may be flush or aligned in the second direction. The third pixel substrate and the fourth pixel substrate may be flush or aligned in the first direction. The fourth pixel substrate and the first pixel substrate may be flush or aligned in the first direction.

The first pixel substrate and the third pixel substrate may be spaced from each other in the first direction and in the second direction. The second pixel substrate and the fourth pixel substrate may be spaced from each other in the first direction and in the second direction.

The touch electrode may be disposed between the first pixel substrate and the third pixel substrate. Additionally or alternatively, the touch electrode may be disposed between the second pixel substrate and the fourth pixel substrate.

An arrangement direction of the touch electrode disposed in a first area adjacent to the respective areas in which the first connection line(s) and the second connection line(s) are disposed may be different from an arrangement direction of a touch electrode disposed in a second area adjacent to the first area along the first direction and/or a touch electrode disposed in a third area adjacent to the first area along the second direction.

The first connection line may include at least one of a gate line, an emission signal line, a high potential power line and a low potential power line.

The second connection line may include at least one of a data line, a high potential power line, a low potential power line and a reference voltage line.

Light emitting elements and/or driving elements for driving the light emitting elements may be disposed in or on the pixel substrates. Each pixel substrate may include at least one light emitting element and/or at least one driving element for driving the light emitting element.

An arrangement direction of the touch electrode disposed in a first area adjacent to the respective areas in which the first connection line(s) and the second connection line(s) are disposed among areas between the plurality of pixel substrates may be different from an arrangement direction of a touch electrode disposed in a second area adjacent to the first area along the first direction and/or a touch electrode disposed in a third area adjacent to the first area along the second direction.

The arrangement direction of the touch electrode disposed in the first area adjacent to the respective areas in which the first connection line(s) and the second connection line(s) are disposed may be identical to an arrangement direction of a touch electrode disposed in a fourth area that is adjacent to the second area along the second direction and/or adjacent to the third area along the first direction.

The arrangement direction of the touch electrode disposed in the first area adjacent to the respective areas in which the first connection line(s) and the second connection line(s) are disposed among areas between the plurality of pixel substrates may be identical to an arrangement direction of a touch electrode disposed in a fourth area that is adjacent to the second area along the second direction and/or adjacent to the third area along the first direction.

The display device may further comprise a touch bridge line disposed on each of the plurality of pixel substrates. The display device may further comprise a touch line disposed along the second direction in an area between the plurality of pixel substrates. Each of the touch bridge line and the touch line may be electrically connected to the touch electrode. The touch bridge line and/or the touch line may be electrically connected to the touch electrode.

The touch electrode may be in contact with the touch line and/or the touch bridge line in each of the plurality of pixel substrates.

The touch electrode, the touch bridge line, and/or the touch line may form one touch unit.

A light emitting element and/or driving elements for driving the light emitting element may be disposed on each of the plurality of pixel substrates. The touch electrode and/or the touch bridge line may be formed in forming the driving element. The touch line may be formed in forming the second connection line. The driving element may comprise the touch electrode and/or the touch bridge line. The second connection line may comprise the touch line.

The display device may comprise a first touch bridge line disposed along the first direction in each of the plurality of pixel substrates. The display device may comprise a touch line disposed along the second direction in an area between the plurality of pixel substrates. The display device may comprise a second touch bridge line disposed along the first direction in the area between the plurality of pixel substrates.

The first touch bridge line may be electrically connected to the touch electrode, the second touch bridge line, and/or the touch line.

The touch electrode, the first touch bridge line, the touch line, and/or the second touch bridge line may form one touch unit.

A support member for supporting the touch electrode may be disposed in an area adjacent to the respective areas in which the first connection lines and/or the second connection lines are disposed.

A support member for supporting the touch electrode may be disposed in an area adjacent to the respective areas in which the first connection line(s) and/or the second connection line(s) are disposed among areas between the plurality of pixel substrates.

The touch electrode may be disposed on the first substrate.

The display device may further comprise a gate driver connected to the first connection lines for sequentially applying a scan signal to each of the plurality of first connection lines in a display period and/or for sequentially applying a touch driving signal to a group of the plurality of first connection lines in a touch period. The touch driving signal may be a signal obtained by a sum of a plurality of scan signals.

The display device may further comprise a data driver configured to apply a data voltage to each of the plurality of second connection lines in the display period; and/or a touch circuit for receiving a touch sensing signal from the second connection lines in the touch period.

The display device may further comprise a first touch electrode disposed on a second substrate; and a plurality of second touch electrodes disposed on a surface of a third substrate facing the second substrate.

The first substrate may include first areas in which the pixel substrates are disposed and second areas between the first areas; and wherein the plurality of second touch electrodes is disposed to face the first areas of the second substrate.

A method of operating a display device is disclosed. The display device may include a first substrate; a plurality of pixel substrates disposed in a matrix form on the first substrate; a plurality of first connection lines connecting a plurality of pixel substrates arranged along a first direction; and a plurality of second connection lines for connecting a plurality of pixel substrates arranged along a second direction, preferably among the plurality of pixel substrates. A scan signal may be sequentially applied to each of the plurality of first connection lines in a display period. A touch driving signal may be sequentially applied to a group of the plurality of first connection lines in a touch period. The touch driving signal may be a signal obtained by a sum of a plurality of scan signals. Any herein disclosed display device may be operated within the method.

A data voltage may be applied to each of the plurality of second connection lines in the display period. A touch sensing signal may be applied to each of the plurality of second connection lines in the touch period.

A display device according to another embodiment of the present disclosure may include a lower substrate on which a first touch electrode is disposed; and a middle substrate having first areas and second areas. The first areas have a plurality of pixel substrates disposed thereon. Each of the first areas has a light emitting element and driving element for driving the light emitting element disposed thereon. The second areas are between the plurality of pixel substrates. The display device includes an upper substrate having a plurality of second touch electrodes disposed on a surface thereof, the surface facing the lower substrate.

The lower substrate may also be called second substrate. The middle substrate may also be called first substrate. The upper substrate may also be called third substrate.

The plurality of second touch electrodes may be disposed to correspond to the first areas of the second substrate.

Any one of the herein disclosed display devices may be a flexible and/or bendable and/or stretchable display device. That is, the first substrate and/or the second substrate and/or the third substrate may be flexible and/or bendable and/or stretchable.

Also, in any one of the herein disclosed display devices, each pixel substrate may include at least one pixel or pixel circuit.

Other detailed matters of the embodiments are included in the detailed description and the drawings.

The present disclosure can provide a display device in which a touch system is embedded by forming touch electrodes in stretched areas where pixel substrates are not disposed on a substrate.

According to the present disclosure, a touch electrode disposed in a stretched area and touch electrodes disposed in stretched areas adjacent to the stretched area along a first direction and a second direction are arranged in different directions, so that touch electrodes that are stretchable along the first direction and the second direction are disposed. Thus, even when the touch electrodes are disposed, they can be stretched along the first direction and the second direction.

According to the present disclosure, a process can be simplified and a manufacturing cost can be reduced by forming a touch electrode, a touch line, and a touch bridge line at the same time when a driving element for driving a light emitting element is formed.

The effects according to the present disclosure are not limited to the contents exemplified above, and more various effects are included in the present specification.

DETAILED DESCRIPTION

Figure 1:
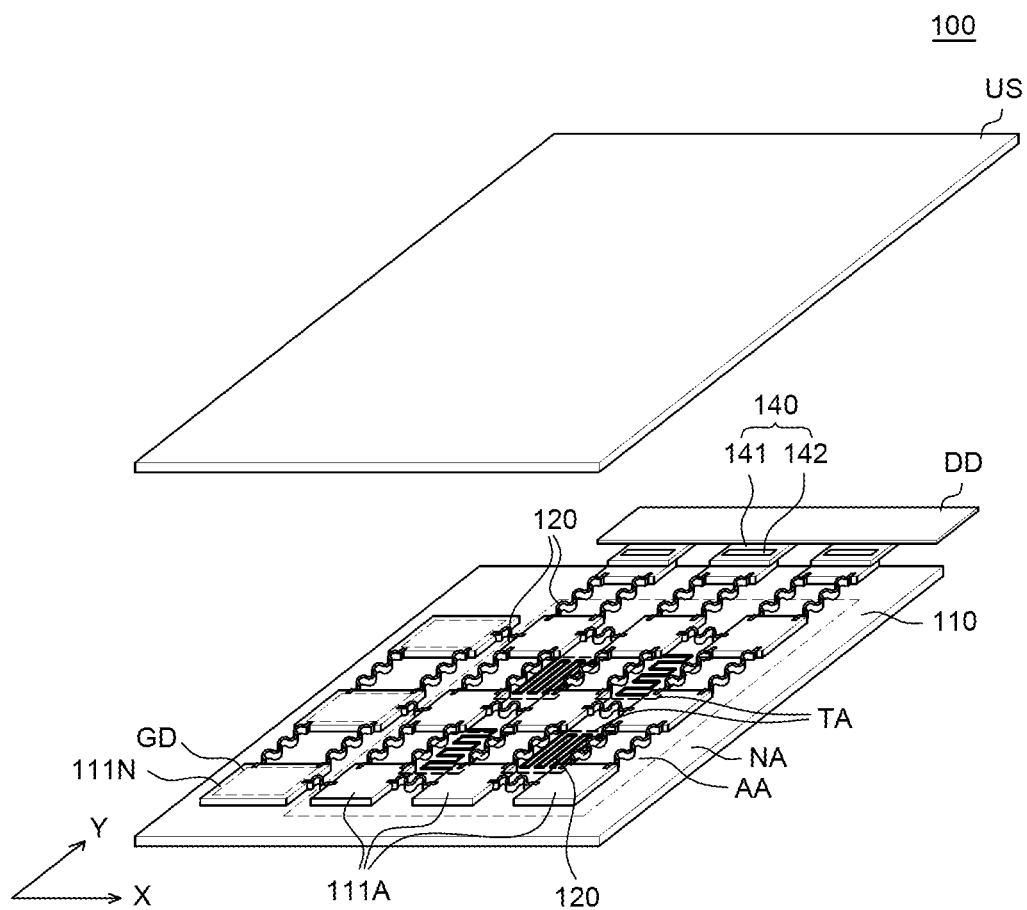
FIG. 1 is an exploded perspective view of a display device according to an embodiment of the present disclosure.

The advantages and features of the present disclosure, and methods for accomplishing the same will be more clearly understood from embodiments described below with reference to the accompanying drawings. However, the present disclosure is not limited to the following embodiments but may be implemented in various different forms. The embodiments are provided only to complete disclosure of the present disclosure and to fully provide a person with ordinary skill in the art to which the present disclosure pertains with the category of the present disclosure, and the present disclosure will be defined by the appended claims.

The shapes, dimensions, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is referred to as being "on" another element or layer, it may be directly on the other element or layer, or intervening elements or layers may be present.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the dimensions and thickness of each component illustrated in the drawings are represented for convenience in explanation, the present disclosure is not necessarily limited to the illustrated dimensions and thickness of each component.

The features of various embodiments of the present disclosure can be partially or entirely coupled to or combined with each other and can be interlocked and operated in technically various ways, and the embodiments can be carried out independently of or in association with each other.

Hereinafter, various embodiments of the present disclosure will be described in detail with reference to the accompanying drawings.

Display Device

A display device according to the present disclosure may be a display device capable of displaying an image even if it is bent or stretched, and may also be referred to as a stretchable display device. The display device according to the present disclosure may have higher flexibility and stretchability than typical display devices. Accordingly, a user can bend or stretch the display device, and a shape of the display device can be freely changed according to the user's manipulation. For example, when the user grabs and pulls an end of the display device, the display device may be stretched in a pulling direction by the user. If the user places the display device on an uneven outer surface, the display device can be disposed to be bent according to a shape of the outer surface. When force applied by the user is removed, the display device can return to an original shape thereof.

FIG. 1 is an exploded perspective view of a display device according to an embodiment of the present disclosure. Referring to FIG. 1, a display device 100 includes a lower substrate 110, an upper substrate US, a plurality of pixel substrates 111A, a plurality of non-pixel substrates 111N, a plurality of connection members 120, chip on films (COF) 140, and a printed circuit board DD.

In general, the lower substrate may also be called first substrate 110.

The lower substrate 110 is a substrate for supporting and protecting various components of the display device 100. In addition, the upper substrate US is a substrate for covering and protecting various components of the display device 100.

Each of the lower substrate 110 and the upper substrate US may be formed of an insulating material that can be bent or stretched as a flexible substrate. For example, each of the lower substrate 110 and the upper substrate US may be formed of an elastomer such as silicone rubber such as polydimethylsiloxane (PDMS), polyurethane (PU), or polytetrafluoroethylene (PTFE) and thus, may have flexible properties. The materials of the lower substrate 110 and the upper substrate US may be the same, but are not limited thereto.

Each of the lower substrate 110 and the upper substrate US is a flexible substrate and may reversibly expand and contract. Accordingly, the lower substrate 110 may be referred to as a lower flexible substrate or a first flexible substrate, and the upper substrate US may also be referred to as an upper flexible substrate or a second flexible substrate. In addition, each of the lower substrate 110 and the upper substrate US may have an elastic modulus of several MPa to several hundred MPa. In addition, a ductile breaking rate of the lower substrate 110 and the upper substrate US may be 100% or more. Here, the ductile breaking rate means an elongation rate at a time at which a stretched object is broken or cracked. A thickness of the lower substrate 110 may be 10 μm to 1 mm, but is not limited thereto.

The lower substrate 110 may have an active area (e.g. display area) AA and a non-active area NA (e.g. non-display area) surrounding the display area AA.

The display area AA is an area in which an image is displayed in the display device 100. A plurality of pixels PX are disposed in the display area AA. In addition, each of the pixels PX may include a display element and various driving elements for driving the display element. The various driving elements may mean at least one thin film transistor (TFT) and a capacitor, but the present disclosure is not limited thereto. In addition, each of the plurality of pixels PX may be connected to various lines. For example, each of the plurality of pixels PX may be connected to various lines such as a gate line, a data line, a high potential power line, a low potential power line, and a reference voltage line.

Touch electrode areas TA may be further present in the display area AA. The touch electrode area TA may be an area bordered by four adjacent pixel substrates 111A. More specifically, the touch electrode area TA may be a spaced area between the pixel substrates 111A in a diagonal direction of X-axis and Y-axis directions based on one pixel substrate 111A.

The non-display area NA is an area adjacent to the display area AA. The non-display area NA is adjacent to the display area AA and surrounds the display area AA. However, the present disclosure is not limited thereto, and the non-display area NA corresponds to an area of the lower substrate 110 excluding the display area AA, which may be deformed and separated into various shapes. Components for driving the plurality of pixels PX disposed in the display area AA are disposed in the non-display area NA. Gate drivers GD may be disposed in the non-display area NA. In addition, a plurality of pads connected to the gate drivers GD and data drivers may be disposed in the non-display area NA, and each of the pads may be connected to each of the plurality of pixels PX in the display area AA.

The plurality of pixel substrates 111A and the plurality of non-pixel substrates 111N are disposed on the lower substrate 110. The plurality of pixel substrates 111A may be disposed in the display area AA of the lower substrate 110, and the plurality of non-pixel substrates 111N may be disposed in the non-display area NA of the lower substrate 110. Although it is illustrated in FIG. 1 that the plurality of non-pixel substrates 111N are disposed in the non-display area NA on an upper side and a left side of the display area AA, the present disclosure is not limited thereto, and the plurality of non-pixel substrates 111N may be disposed in an arbitrary area of the non-display area NA.

The plurality of pixel substrates 111A and the plurality of non-pixel substrates 111N are rigid substrates and are respectively independently disposed on the lower substrate 110 to be spaced apart from each other. The plurality of pixel substrates 111A and the plurality of non-pixel substrates 111N may be more rigid than the lower substrate 110. That is, the lower substrate 110 may have a more flexible characteristic than the plurality of pixel substrates 111A and the plurality of non-pixel substrates 111N, and the plurality of pixel substrates 111A and the plurality of non-pixel substrates 111N may have a more rigid characteristic than the lower substrate 110.

The plurality of pixel substrates 111A and the plurality of non-pixel substrates 111N, which are a plurality of rigid substrates, may be formed of a plastic material having flexibility, for example, may be formed of polyimide (PI), polyacrylate, polyacetate, or the like. In this case, the plurality of pixel substrates 111A and the plurality of non-pixel substrates 111N may be formed of the same material, but are not limited thereto, and may be formed of different materials.

A modulus of the plurality of pixel substrates 111A and the plurality of non-pixel substrates 111N may be 10 times greater, preferably 100 times greater, more preferably 1000 times greater, than a modulus of the lower substrate 110, but the present disclosure is not limited thereto. The modulus may be an elastic modulus. For example, an elastic modulus of the plurality of pixel substrates 111A and the plurality of non-pixel substrates 111N may be 2 GPa to 9 GPa depending on transparency. More specifically, when the plurality of pixel substrates 111A and the plurality of non-pixel substrates 111N are transparent, the elastic modulus may be 2 GPa, and when the plurality of pixel substrates 111A and the plurality of non-pixel substrates 111N are opaque, the elastic modulus may be 9 GPa. However, the present disclosure is not limited thereto. Accordingly, the plurality of pixel substrates 111A and the plurality of non-pixel substrates 111N may be a plurality of rigid substrates having rigidity compared to the lower substrate 110.

The plurality of pixels PX may be disposed on the plurality of pixel substrates 111A, and the gate drivers GD may be disposed on the non-pixel substrates 111N located on the left side of the display area AA among the plurality of non-pixel substrates 111N. The gate drivers GD may be formed on the non-pixel substrates 111N by a gate in panel (GIP) method when various components on the pixel substrates 111A are manufactured. Accordingly, various circuit components constituting the gate driver GD, such as various transistors, capacitors, and lines may be disposed on the plurality of non-pixel substrates 111N. However, the present disclosure is not limited thereto, and the gate driver GD may be mounted in a chip on film (COF) method. In addition, the plurality of non-pixel substrates 111N are also disposed in the non-display area NA located on the right side of the display area AA, and the gate drivers GD may also be mounted on the plurality of non-pixel substrates 111N located on the right side of the display area AA.

A size of the plurality of non-pixel substrates 111N may be greater than a size of the plurality of pixel substrates 111A. Specifically, a size of each of the plurality of non-pixel substrates 111N may be greater than a size of each of the plurality of pixel substrates 111A. As described above, the gate driver GD is disposed on each of the plurality of non-pixel substrates 111N, and, for example, one stage of the gate driver GD may be disposed on each of the plurality of non-pixel substrates 111N. Accordingly, since an area occupied by various circuit components constituting one stage of the gate driver GD is relatively greater than an area of the pixel substrate 111A on which the pixel PX is disposed, the size of each of the plurality of non-pixel substrates 111N may be greater than the size of each of the plurality of pixel substrates 111A.

The COF 140 is a film in which various components are disposed on a base film 141 having flexibility, and is a component for supplying signals to the plurality of sub-pixels of the display area AA. The COF 140 may be bonded to the plurality of pads of the plurality of non-pixel substrates 111N disposed in the non-display area NA and supply a power supply voltage, a data voltage, a gate voltage, and the like to each of the plurality of sub-pixels of the display area AA through the pads. The COF 140 includes a base film 141 and a driver IC 142, and addition to this, may have various components disposed thereon.

The base film 141 is a layer for supporting the driver IC 142 of the COF 140. The base film 141 may be formed of an insulating material, for example, may be formed of an insulating material having flexibility.

The driver IC 142 is a component that processes data for displaying an image and a driving signal for processing the data. FIG. 1 illustrates that the driver IC 142 is mounted by a method of the COF 140, but the present disclosure is not limited thereto. The driver IC 142 may also be mounted by a chip on glass (COG) method, a tape carrier package (TCP) method or the like.

In FIG. 1, it is illustrated that one non-pixel substrate 111N is disposed in the non-display area NA on the upper side of the display area AA to correspond to one row of the pixel substrates 111A disposed in the display area AA and one COF 140 is disposed in one non-pixel substrate 111N, but the present disclosure is not limited thereto. That is, one non-pixel substrate 111N and one COF 140 may be disposed to correspond to a plurality of rows of the pixel substrates 111A.

A controller such as an IC chip or a circuit unit may be mounted on a printed circuit board DD. In addition, a memory, a processor or the like may be mounted on the printed circuit board DD. The printed circuit board DD is a component to transmit signals for driving the display element from the controller to the display element. Although it is illustrated that one printed circuit board DD is used in FIG. 1, the number of printed circuit boards DD is not limited thereto. Also, the printed circuit board may be referred to as a data driver.

The plurality of connection members 120 may be disposed between the plurality of pixel substrates 111A, between the plurality of non-pixel substrates 111N, and between the plurality of pixel substrates 111A and the plurality of non-pixel substrates 111N. The plurality of connection members 120 will be described in more detail with reference to FIGS. 3 and 4a below.

As described above, the display device 100 of the present disclosure can implement a touch system capable of sensing a touch while being stretchable. Hereinafter, implementation of a touch unit for touch sensing of the display device 100 according to an embodiment of the present disclosure will be described in more detail with reference to FIG. 2. The touch unit may include touch circuitry, and may be referred to as touch circuitry.

Touch System

Figure 2:
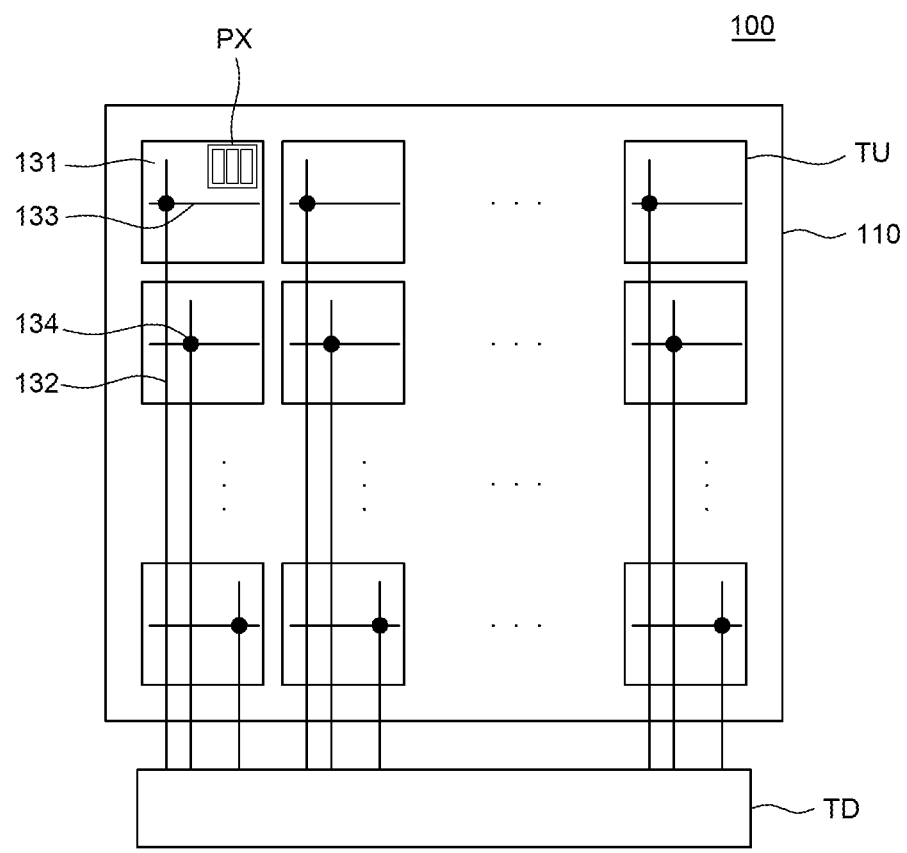
FIG. 2 is a plan view schematically illustrating a touch system of FIG. 1.

FIG. 2 is a plan view schematically illustrating the touch system of FIG. 1. Referring to FIG. 2, a plurality of touch electrodes 131 serving as touch sensors are embedded in the display area AA of the display device 100. When a conductor such as a finger or a pen touches the touch electrode 131, the touch electrode 131 recognizes the touch through a change in capacitance that is generated as a small amount of electric charge moves to a touch point. The display device 100 may include a touch circuit TD for sensing a touch by driving the plurality of touch electrodes 131.

The touch circuit TD may sequentially drive the plurality of touch electrodes 131 by sequentially supplying touch driving signals to the plurality of touch electrodes 131. Thereafter, the touch circuit TD receives touch sensing signals from the touch electrodes 131 to which the touch driving signals are applied. The touch circuit TD may calculate presence or absence of a touch and touch coordinates based on the touch sensing signal received from each of the plurality of touch electrodes 131.

Each of the plurality of touch electrodes 131 may form a touch unit TU. A plurality of touch units TU may be partitioned by grouping the plurality of pixels PX. That is, since each pixel PX is disposed on each of the plurality of pixel substrates 111A disposed on the lower substrate 110, the plurality of touch units TU may be partitioned by grouping some of the plurality of pixel substrates 111A.

Each touch unit TU may include the touch electrode 131 serving as a touch sensor, touch lines 132 for transmitting the touch driving signal and the touch sensing signal to the touch circuit TD, touch bridge lines 133 arranged in a direction crossing the touch lines 132 for configuring the touch unit TU, and touch contact units 134 allowing one touch electrode 131 among the plurality of touch electrodes 131 to be connected to the corresponding touch unit TU.

Hereinafter, the display device 100 including the touch unit TU according to an embodiment of the present disclosure will be described in more detail with reference to FIGS. 3 to 5.

Planar and Cross-sectional Structures

Figure 3:
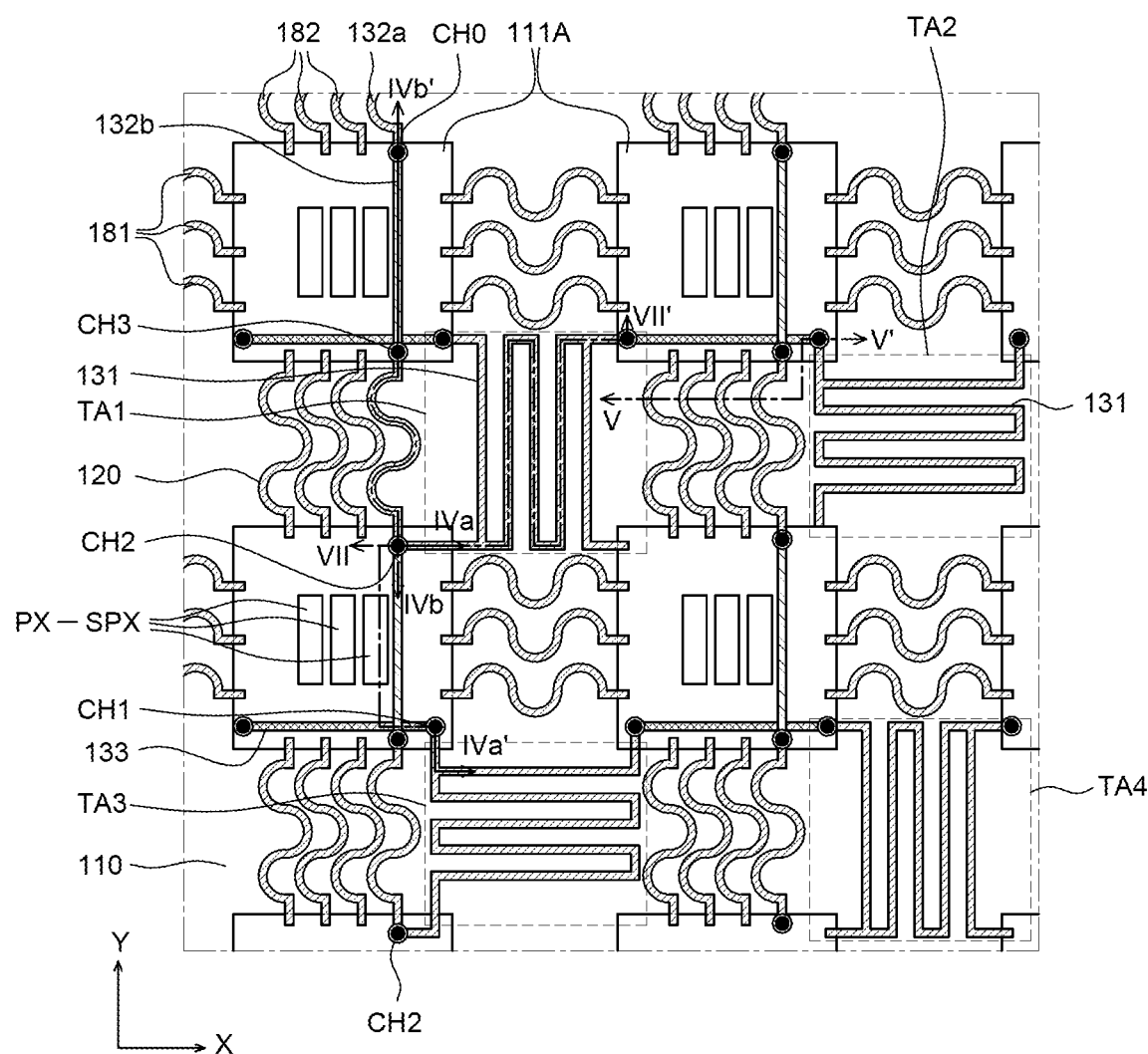
FIG. 3 is an enlarged plan view of a touch unit TU of the display device according to an embodiment of the present disclosure.
Figure 4A:
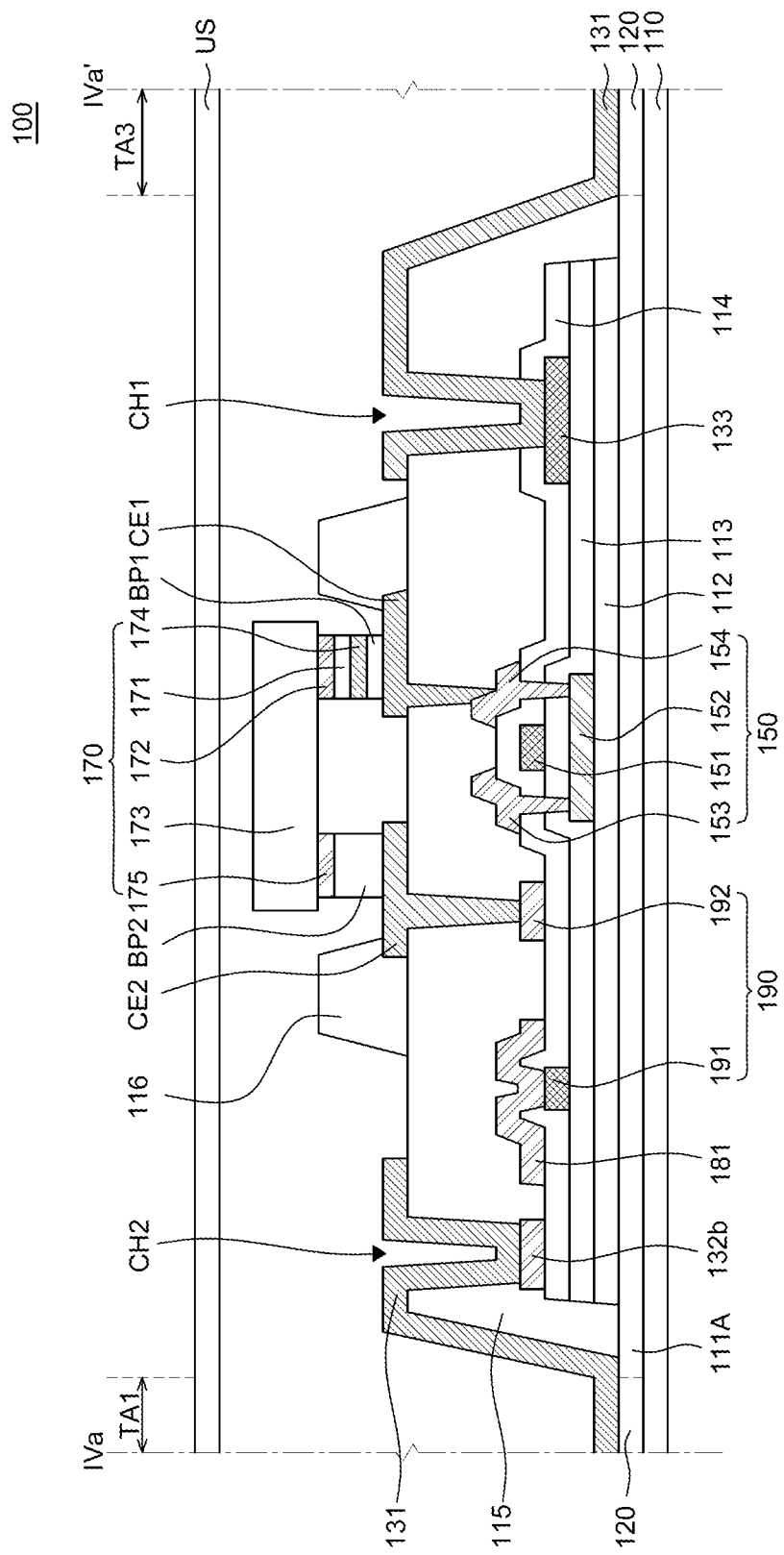
FIG. 4a is a cross-sectional view taken along IVa-IVa' of FIG. 3.
Figure 4B:
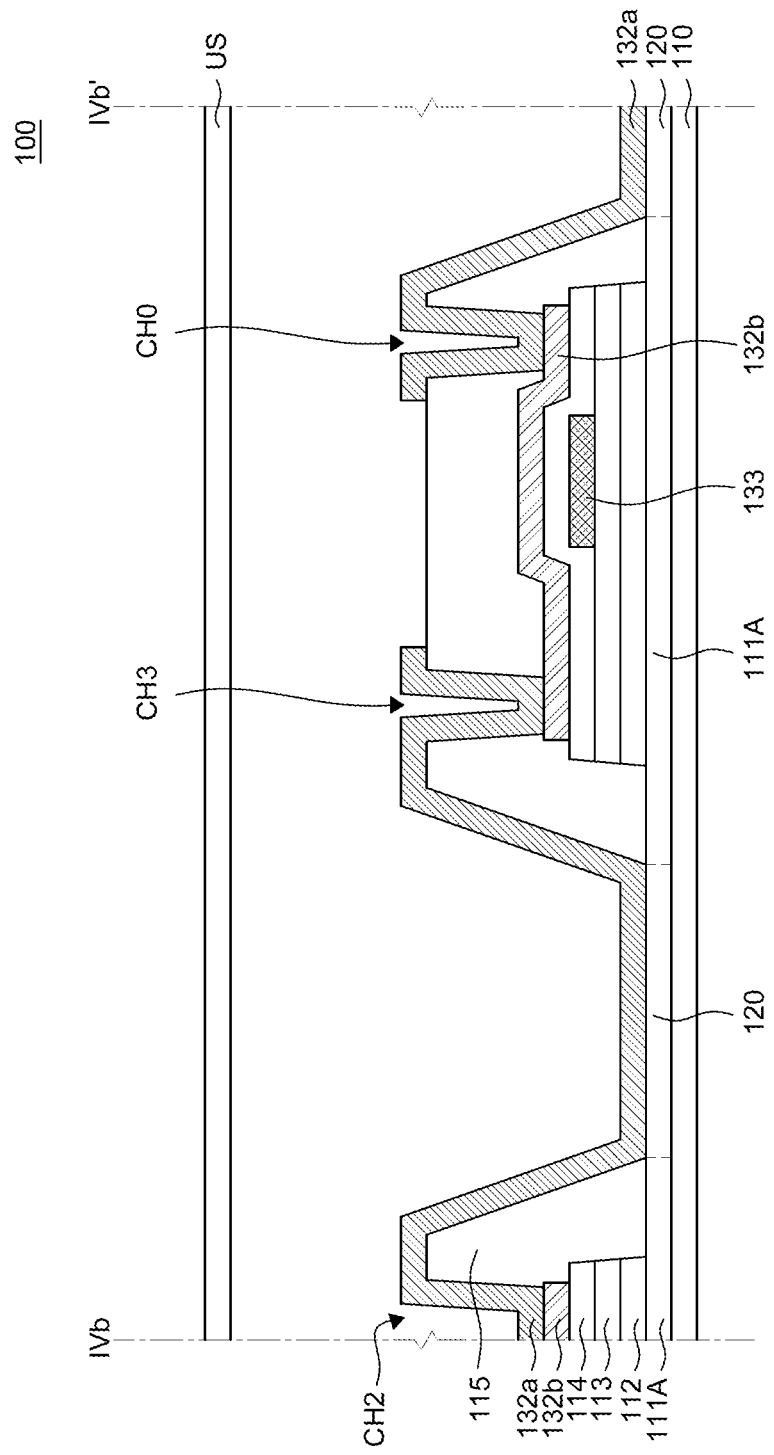
FIG. 4b is a cross-sectional view taken along IVb-IVb' of FIG. 3.

FIG. 3 is an enlarged plan view of the touch unit TU of the display device according to an embodiment of the present disclosure. FIG. 4a is a cross-sectional view taken along IVa-IVa' of FIG. 3. FIG. 4b is a cross-sectional view taken along IVb-IVb' of FIG. 3. FIG. 5 is a cross-sectional view taken along line V-V' of FIG. 3. For convenience of explanation, descriptions will be made with reference to FIG. 1. For reference, FIG. 3 may be an enlarged plan view of one touch unit TU in the display area.

Referring to FIGS. 1 and 3, the plurality of pixel substrates 111A are disposed on the lower substrate 110 in the display area AA. The plurality of pixel substrates 111A are disposed on the lower substrate 110 to be spaced apart from each other. For example, the plurality of pixel substrates 111A may be arranged in a matrix form on the lower substrate 110 as illustrated in FIGS. 1 and 3, but the present disclosure is not limited thereto. The plurality of pixels PX may be grouped in the touch unit TU. At least two pixels PX may be included in the touch unit TU. In FIG. 3, the touch unit TU including four pixels PX will be described as an example. Each of the pixel substrates 111A may belong to a row (e.g., first pixel substrates) of the pixel substrates 111A and to a column (e.g., second pixel substrates) of the pixel substrates 111A.

Referring to FIGS. 1 and 3, a plurality of sub-pixels SPX constituting the plurality of pixels PX and the touch bridge lines 133 are disposed on the plurality of pixel substrates 111A. The touch bridge lines 133 are disposed in the X-axis direction which is a first direction, and are disposed in a straight line shape on the plurality of pixel substrates 111A. The touch bridge line 133 may be electrically connected to the touch electrode 131 and the touch line 132 disposed on the lower substrate 110 through a first contact hole CH1 and a second contact hole CH2 to thereby form the touch unit TU.

The plurality of connection members 120 may be disposed between the plurality of pixel substrates 111A, between the plurality of non-pixel substrates 111N, or between the plurality of pixel substrates 111A and the plurality of non-pixel substrates 111N. The connection members 120 may be disposed on the same layer as the plurality of pixel substrates 111A. In addition, the connection members 120 may be formed of the same material as the plurality of pixel substrates 111A, and may have the same stacked structure.

Referring to FIG. 3, the plurality of connection members 120 have a bent shape. For example, as illustrated in FIG. 3, the plurality of connection members 120 may have a sinusoidal shape. However, the shape of the plurality of connection members 120 is not limited thereto, and for example, the plurality of connection members 120 may extend in a zigzag manner, and may have various shapes such as a shape in which a plurality of rhombus-shaped substrates are connected at vertices thereof to extend. In addition, the number and shape of the plurality of connection members 120 illustrated in FIG. 3 are exemplary, and the number and shape of the plurality of connection members 120 may be variously changed according to design.

Referring to FIG. 3, the number of the plurality of connection members 120 disposed between the pixel substrates 111A adjacent in the X-axis direction which is the first direction may be different from the number of the plurality of connection members 120 disposed between the pixel substrates 111A adjacent in the Y-axis direction which is a second direction. As illustrated in FIG. 3, the number of the plurality of connection members 120 arranged in the X-axis direction is smaller than the number of the plurality of connection members 120 arranged in the Y-axis direction. More specifically, one of the plurality of connection members 120 arranged in the Y-axis direction may support the touch line 132 that transmits a touch signal.

Referring to FIG. 3, the touch electrode area TA is present between four pixel substrates 111A disposed adjacent to each other in the X-axis direction and the Y-axis direction, and the connection members 120 may also be disposed in the touch electrode area TA. As illustrated in FIG. 3, an area that is located in a first column of a first row in the Y-axis direction may be referred to as a first touch electrode area TA1 and an area that is located in a second column of the first row in the Y-axis direction may be referred to as a second touch electrode area TA2. In addition, an area that is located in the first column of a second row in the Y-axis direction may be referred to as a third touch electrode area TA3, and an area that is located in the second column of the second row in the Y-axis direction may be referred to as a fourth touch electrode area TA4. The connection members 120 may be support members 120, and may be referred to as the support members 120.

The connection member 120 arranged in the first touch electrode area TA1 and the connection member 120 arranged in the fourth touch electrode area TA4 may have the same arrangement direction, and the connection member 120 arranged in the second touch electrode area TA2 and the connection member 120 arranged in the third touch electrode area TA3 may have the same arrangement direction. The arrangement direction of the connection members 120 arranged in the first touch electrode area TA1 and the fourth touch electrode area TA4 may be different from the arrangement direction of the connection members 120 arranged in the second touch electrode area TA2 and the third touch electrode area TA3. In addition, the connection members 120 disposed in the first touch electrode area TA1 and the fourth touch electrode area TA4 may have a shape that is advantageous to stretching when the lower substrate 110 is stretched in the X-axis direction, and the connection members 120 disposed in the second touch electrode area TA2 and the third touch electrode area TA3 may have a shape that is advantageous to stretching when the lower substrate 110 is stretched in the Y-axis direction. The touch electrodes 131 are disposed in the touch electrode areas TA according to the shapes of the connection members 120. Accordingly, the display device 100 according to the present disclosure can be stretched in both the X-axis direction and the Y-axis direction even when a touch system is implemented by disposing the touch electrodes 131 in the display device 100. As illustrated in FIGS. 3 and 4a, in the display device 100 according to an embodiment of the present disclosure, a touch system can be implemented within the display device 100 by disposing the touch electrodes 131 on the connection members 120 after the connection members 120 are formed in the touch electrode areas TA where the connection members 120 are not previously disposed.

Figure 5:
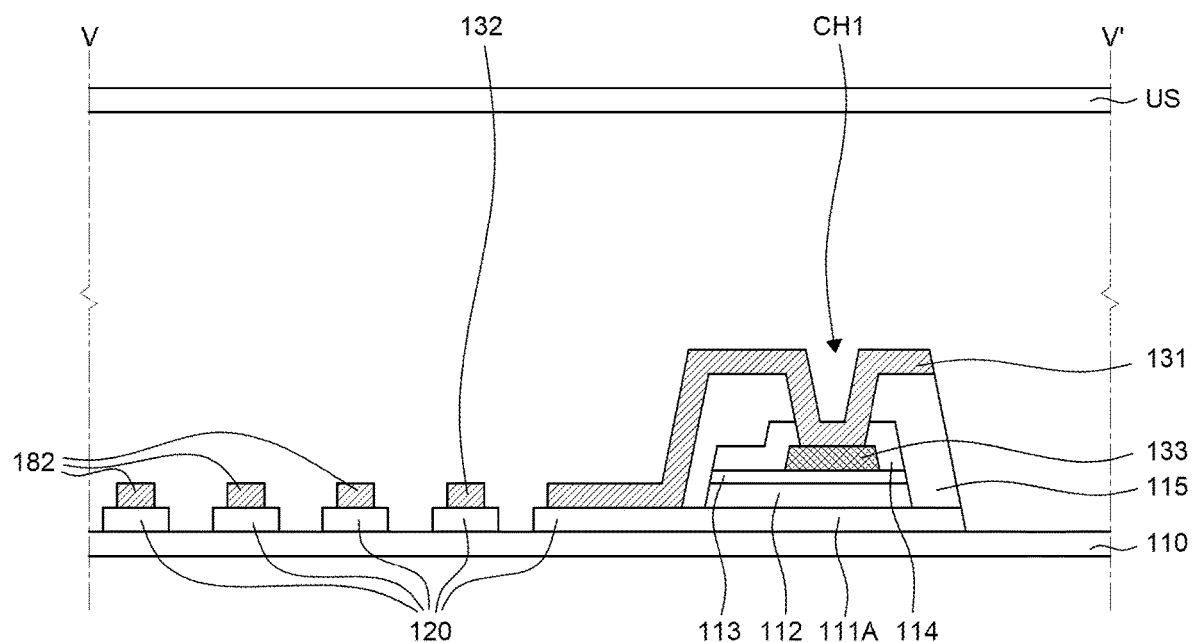
FIG. 5 is a cross-sectional view taken along line V-V' of FIG. 3.

Referring to FIGS. 3 to 5, a plurality of connection lines 180, the plurality of touch electrodes 131, and a plurality of the touch lines 132 may be disposed on the plurality of connection members 120. The plurality of connection lines 180, the plurality of touch electrodes 131, and the plurality of touch lines 132 are disposed on the plurality of connection members 120, and may have shapes corresponding to the plurality of connection members 120. For example, the plurality of connection lines 180, the plurality of touch electrodes 131, and the plurality of touch lines 132 may have the same shape as the connection members 120. As illustrated in FIG. 3, the plurality of connection lines 180, the plurality of touch electrodes 131, and the plurality of touch lines 132 may have a sinusoidal shape.

Referring to FIGS. 3 to 5, the plurality of connection lines 180 electrically connect pads disposed on adjacent pixel substrates 111A among the plurality of pixel substrates 111A and may extend in a shape in which they are bent between respective pads 190. For example, as illustrated in FIG. 3, the plurality of connection lines 180 may extend in a zigzag manner. The plurality of connection lines 180 may have various shapes, such as a shape in which a plurality of rhombus-shaped lines are connected at vertices to extend.

The connection lines 180 may include first connection lines 181 and second connection lines 182. The first connection lines 181 and the second connection lines 182 may be disposed on the plurality of pixel substrates 111A and the plurality of connection members 120. Specifically, the first connection lines 181 may include lines that are disposed on the connection members 120 extending in the X-axis direction which is the first direction among the plurality of connection members 120, and lines that are disposed on the plurality of pixel substrates 111A. The second connection lines 182 may include lines that are disposed on the connection members 120 extending in the Y-axis direction which is the second direction among the plurality of connection members 120, and lines disposed on the plurality of pixel substrates 111A. The connection lines 180 may be formed of a metallic material such as copper (Cu), aluminum (Al), titanium (Ti), or molybdenum (Mo) or may be formed of a stacked structure of a metallic material such as copper/molybdenum-titanium (Cu/Moti), titanium/aluminum/titanium (Ti/Al/Ti) or the like, but the present disclosure is not limited thereto.

Referring to FIGS. 1 and 3, the first connection line 181 may connect pads on two pixel substrates 111A (e.g., first neighboring pixel substrates 111A) that are disposed side by side among the pads on the plurality of pixel substrates 111A adjacent to each other in the X-axis direction. The first connection line 181 may function as a gate line, an emission signal line, a high potential power line, or a low potential power line, but is not limited thereto. As illustrated in FIG. 3, the first connection line 181 may function as a power supply line for transmitting a high potential voltage among power voltages, and may electrically connect pads on two pixel substrates 111A that are disposed side by side in the X-axis direction.

Referring to FIG. 3, the second connection line 182 may connect two pixel substrates 111A (e.g., second neighboring pixel substrates 111A) that are disposed side by side among the plurality of pixel substrates 111A adjacent to each other in the Y-axis direction. The second connection line 182 may function as a data line, a high potential power line, a low potential power line, or a reference voltage line, but is not limited thereto. For example, the second connection line 182 may function as a data line, and may electrically connect data lines on the two pixel substrates 111A disposed side by side in the Y-axis direction.

The touch electrode 131 may be disposed in the touch electrode area TA between the four pixel substrates 111A disposed adjacent to each other in the X-axis direction and the Y-axis direction. For example, the touch electrode 131 may be disposed on the connection member 120 positioned in the touch electrode area TA. The touch electrode 131 may be disposed in an area adjacent to areas in which the first connection lines 181 and the second connection lines 182 are disposed among spaces between the plurality of pixel substrates 111A. The touch electrode 131 may be disposed in an area where the first connection line 181 and the second connection line 182 are not disposed among the spaces between the plurality of pixel substrates 111A.

An arrangement direction of the touch electrode 131 disposed in the first area TA1 of the touch electrode area TA is different from an arrangement direction of the touch electrode 131 disposed in the second area TA2 adjacent to the first area TA1 in the X-axis direction. In addition, the arrangement direction of the touch electrode 131 disposed in the first area TA1 may also be different from an arrangement direction of the touch electrode 131 disposed in the third area TA3 adjacent to the first area TA1 in the Y-axis direction. In contrast, the arrangement direction of the touch electrode 131 disposed in the first area TA1 of the touch electrode area TA may be identical to the arrangement direction of the touch electrode 131 disposed in the fourth area TA4 adjacent to the second area TA2 and the third area TA3. The fourth area TA4 of the touch electrode area TA may be an area adjacent to the first area TA1 in a diagonal direction. In the touch unit TU, the touch electrode 131 may be electrically connected to the touch bridge line 133 disposed on each pixel substrate 111A. The touch electrode 131 may have a bent shape in the touch electrode area TA. However, the shape of the touch electrode 131 is not limited thereto, and may have various stretchable shapes. For example, the touch electrode 131 may be shaped in a zig-zag manner. In addition, the touch electrode 131 may be formed in a shape in which it is bent upward and downward.

The touch line 132 may be disposed in the same direction as a plurality of the second connection lines 182. That is, the touch line 132 may be disposed between the pixel substrates 111A arranged in the Y-axis direction. The touch line 132 may be electrically connected to the touch electrode 131. The touch line 132 may extend in a bent shape. However, the shape of the plurality of touch lines 132 is not limited thereto, and the plurality of touch lines 132 may have various stretchable shapes. For example, the touch line 132 may be shaped in a zig-zag manner. In addition, the touch line 132 may be formed in a shape in which it is bent upward and downward.

Referring to FIGS. 3 and 4b, the touch lines 132 may be disposed on the plurality of pixel substrates 111A and the connection members 120. Specifically, the touch line 132 may include a first touch line 132a disposed on an upper surface of the connection member 120, and a second touch line 132b disposed on an upper surface of the pixel substrate 111A. The first touch line 132a may be formed of the same material as the first connection line 181 or the second connection line 182, but is not limited thereto. In addition, the second touch line 132b may be formed of the same material as a source electrode 153 and a drain electrode 154, but is not limited thereto. When the first touch line 132a and the second touch line 132b are integrally formed, the first touch line 132a and the second touch line 132b may be formed of the same material as the first connection line 181 or the second connection line 182.

As illustrated in FIG. 3, the first touch lines 132a and the second touch lines 132b may be electrically connected through a touch line contact hole CH0, the second contact hole CH2, and a third contact hole CH3. The touch line 132 may be electrically connected to the touch electrode 131 through the second contact hole CH2. More specifically, considering IVb to IVb' of FIG. 4b sequentially, the second touch line 132b is in contact with and electrically connected to the first touch line 132a through the second contact hole CH2. In addition, the first touch line 132a is formed on a side surface of a planarization layer 115 and the upper surface of the connection member 120. In addition, the first touch line 132a is in contact with and electrically connected to the second touch line 132b through the third contact hole CH3. In addition, the second touch line 132b is disposed on the pixel substrate 111A. The second touch line 132b and the touch bridge line 133 overlap but are not connected by a contact hole. In addition, the second touch line 132b is in contact with and electrically connected to the first touch line 132a through the touch line contact hole CH0.

Referring to FIGS. 4a, 4b, and 5, a plurality of inorganic insulating layers are disposed on the plurality of pixel substrates 111A. For example, the plurality of inorganic insulating layers may include a buffer layer 112, a gate insulating layer 113, and an interlayer insulating layer 114, but are not limited thereto. And, various inorganic insulating layers may be additionally disposed on the plurality of pixel substrates 111A. Alternatively, at least one of the buffer layer 112, the gate insulating layer 113, and the interlayer insulating layer 114 may be omitted.

Referring to FIGS. 4a, 4b, and 5, the buffer layer 112 may be disposed on the plurality of pixel substrates 111A. The buffer layer 112 is formed on the plurality of pixel substrates 111A to protect various components of the display device 100 from penetration of moisture ($H_2O$) and oxygen ($O_2$) from outside the lower substrate 110 and the plurality of pixel substrates 111A. The buffer layer 112 may be formed of an insulating material, and for example, an inorganic layer formed of silicon nitride (SiNx), silicon oxide (SiOx), silicon oxynitride (SiON), or the like may be formed as a single layer or a multilayer therefor. However, the buffer layer 112 may be omitted depending on a structure or characteristics of the display device 100.

In this case, the buffer layer 112 may be formed only in areas overlapping the plurality of pixel substrates 111A and the plurality of non-pixel substrates 111N. As described above, since the buffer layer 112 may be formed of an inorganic material, damage such as cracks may easily occur in a process of stretching the display device 100. Accordingly, the buffer layer 112 is not formed in areas between the plurality of pixel substrates 111A and the plurality of non-pixel substrates 111N, but is patterned in shapes of the plurality of pixel substrates 111A and the plurality of non-pixel substrates 111N and may be formed only on the plurality of pixel substrates 111A and the plurality of non-pixel substrates 111N. Accordingly, in the display device 100 according to an embodiment of the present disclosure, the buffer layer 112 is formed only in the areas overlapping the plurality of pixel substrates 111A and the plurality of non-pixel substrates 111N, which are rigid substrates, so that damage to the buffer layer 112 can be prevented even when the display device 100 is deformed, such as bent or stretched.

Referring to FIG. 4a, a transistor 150 including a gate electrode 151, an active layer 152, the source electrode 153, and the drain electrode 154 is formed on the buffer layer 112.

The active layer 152 is disposed on the buffer layer 112. For example, the active layer 152 may be formed of an oxide semiconductor, amorphous silicon (a-Si), polycrystalline silicon (poly-Si), an organic semiconductor or the like.

The gate insulating layer 113 is disposed on the active layer 152. The gate insulating layer 113 is a layer for electrically insulating the gate electrode 151 and the active layer 152 and may be formed of an insulating material. For example, the gate insulating layer 113 may be formed as a single layer of silicon nitride (SiNx) or silicon oxide (SiOx) which is an inorganic material or a multilayer of silicon nitride (SiNx) or silicon oxide (SiOx), but is not limited thereto.

The gate electrode 151 is disposed on the gate insulating layer 113. The gate electrode 151 is disposed to overlap the active layer 152. The gate electrode 151 may be formed of any one of various metallic materials, for example, molybdenum (Mo), aluminum (Al), chromium (Cr), gold (Au), titanium (Ti), nickel (Ni), neodymium (Nd), and copper (Cu), an alloy of two or more thereof, or a multilayer thereof, but the present disclosure is not limited thereto.

The interlayer insulating layer 114 is disposed on the gate electrode 151. The interlayer insulating layer 114 is a layer for insulating the gate electrode 151 and the source electrode 153 and the drain electrode 154 and may be formed of an inorganic material in the same manner as the buffer layer 112. For example, the interlayer insulating layer 114 may be formed of any one of various metallic materials, for example, molybdenum (Mo), aluminum (Al), chromium (Cr), gold (Au), titanium (Ti), nickel (Ni), neodymium (Nd), and copper (Cu), an alloy of two or more thereof, or a multilayer thereof, but the present disclosure is not limited thereto.

The source electrode 153 and the drain electrode 154 that are respectively in contact with the active layer 152 are disposed on the interlayer insulating layer 114. The source electrode 153 and the drain electrode 154 are spaced apart from each other on the same layer. The source electrode 153 and the drain electrode 154 may be electrically connected to the active layer 152 in a manner in contact with the active layer 152. The source electrode 153 and the drain electrode 154 may be formed of any one of various metallic materials, for example, molybdenum (Mo), aluminum (Al), chromium (Cr), gold (Au), titanium (Ti), nickel (Ni), neodymium (Nd), and copper (Cu), an alloy of two or more thereof, or a multilayer thereof, but the present disclosure is not limited thereto.

In addition, the gate insulating layer 113 and the interlayer insulating layer 114 may be patterned and formed only in areas overlapping the plurality of pixel substrates 111A. Since the gate insulating layer 113 and the interlayer insulating layer 114 may also be formed of the same inorganic material as the buffer layer 112, damage such as cracks may easily occur in the process of stretching the display device 100. Accordingly, the gate insulating layer 113 and the interlayer insulating layer 114 are not formed in the areas between the plurality of pixel substrates 111A, but are patterned in the shape of the plurality of pixel substrates 111A and may be formed only on the plurality of pixel substrates 111A.

FIG. 4a illustrates only a driving transistor among various transistors that may be included in the display device 100 for convenience of explanation, but a switching transistor, a capacitor, and the like may also be included in the display device 100. In addition, although it has been described herein that the transistor 150 has a coplanar structure, various transistors such as having a staggered structure or the like may also be used.

Referring to FIG. 4a, a gate pad 191 among a plurality of the pads 190 is disposed on the gate insulating layer 113. The gate pad 191 is a pad for transmitting a gate signal to the plurality of sub-pixels SPX. The gate pad 191 may be formed of the same material as the gate electrode 151, but the present disclosure is not limited thereto.

The gate pad 191 is connected to the first connection line 181 functioning as a gate line, and the first connection line 181 is disposed to extend from the upper surface of the connection member 120 to an upper surface of the interlayer insulating layer 114 while contacting side surfaces of the buffer layer 112, the gate insulating layer 113, and the interlayer insulating layer 114. The first connection line 181 may contact the gate pad 191 through a contact hole of the interlayer insulating layer 114. Accordingly, the first connection line 181 may be electrically connected to the gate pad 191 and transmit a gate signal to the gate pad 191.

Referring to FIGS. 4a and 5, the touch bridge line 133 is disposed on the gate insulating layer 113. The touch bridge line 133 is connected to the touch electrode 131 through the first contact hole CH1 to thereby configure the touch unit TU. In this case, the first contact hole CH1 may be disposed on the pixel substrate 111A. The touch bridge line 133 may be formed of the same material as the gate electrode 151 of the transistor 150, but is not limited thereto.

Referring to FIG. 4a, a power pad 192 among the plurality of pads 190 is disposed on the interlayer insulating layer 114. The power pad 192 is for applying a power signal or a power voltage to the plurality of sub-pixels SPX. The power pad 192 may be formed of the same material as the source electrode 153 or the drain electrode 154 of the transistor 150, but is not limited thereto.

Referring to FIG. 4a, the planarization layer 115 is formed on the transistor 150, the power pad 192, and the interlayer insulating layer 114. The planarization layer 115 planarizes an upper portion of the transistor 150 and a lower portion of the light emitting element 170. The planarization layer 115 may be formed as a single layer or a plurality of layers, and may be formed of an organic material. Accordingly, the planarization layer 115 may be referred to as an organic insulating layer. For example, the planarization layer 115 may be formed of an acryl-based organic material, but is not limited thereto.

In some embodiments, a passivation layer may be formed between the transistor 150 and the planarization layer 115. That is, in order to protect the transistor 150 from penetration of moisture and oxygen, a passivation layer covering the transistor 150 may be formed. The passivation layer may be formed of an inorganic material, and may be formed as a single layer or a multilayer, but is not limited thereto.

Referring to FIG. 4a, a first connection electrode CE1 and a second connection electrode CE2 are disposed on the planarization layer 115.

The first connection electrode CE1 is an electrode that electrically connects the transistor 150 and the light emitting element 170. The first connection electrode CE1 may be disposed on the planarization layer 115 to contact the light emitting element 170, and may come into contact with the drain electrode 154 of the transistor 150 through a contact hole formed in the planarization layer 115. Accordingly, the light emitting element 170 and the drain electrode 154 of the transistor 150 may be electrically connected to each other by the first connection electrode CE1. However, the present embodiment is not limited thereto, and the first connection electrode CE1 may be connected to the source electrode 153 of the transistor 150 depending on a type of the transistor 150.

The second connection electrode CE2 is an electrode that electrically connects the light emitting element 170 and the power pad 192. The second connection electrode CE2 may be disposed on the planarization layer 115, and may contact the light emitting element 170 and may contact the power pad 192 through a contact hole formed in the planarization layer 115. Accordingly, the light emitting element 170 and the power pad 192 may be electrically connected to each other by the second connection electrode CE2.

Referring to FIGS. 4a and 5, the touch electrode 131 is disposed on the planarization layer 115. The touch electrode 131 serves as a sensor for sensing a touch, and is disposed in the touch electrode area TA as illustrated in FIG. 3. The touch electrode 131 may be electrically connected to the touch bridge line 133 through the first contact hole CH1. Also, the touch electrode 131 may be electrically connected to the touch line 132 through the second contact hole CH2. For example, the touch unit TU may include a plurality of the touch electrode areas TA. In addition, the touch electrode 131 may be disposed in each of the plurality of touch electrode areas TA. The touch electrodes 131 respectively disposed in the plurality of touch electrode areas TA may be electrically connected to each other through the touch bridge lines 133 and the touch lines 132. Accordingly, the plurality of touch electrode areas TA disposed in the touch unit TU may be electrically connected to be grouped.

As described above, in the display device 100 according to an embodiment of the present disclosure, the touch electrodes 131, the touch lines 132, and the touch bridge lines 133 capable of implementing a touch system can be formed during a manufacturing process. Thus, while implementing the touch system in the display device 100, it is possible to reduce a manufacturing cost with simplification of the manufacturing process.

Referring to FIG. 4a, a bank 116 is disposed on the first connection electrode CE1, the second connection electrode CE2, and the planarization layer 115. The bank 116 may be configured to include a black material in order to prevent light emitted from the light emitting element 170 from being transmitted to the sub-pixel SPX adjacent thereto and causing color mixing. The bank 116 may be formed of an organic insulating material, and may be formed of the same material as the planarization layer 115. For example, the bank 116 may be formed of an acryl-based resin, a benzocyclobutene (BCB)-based resin, or polyimide, but is not limited thereto.

The light emitting element 170 is disposed on the first connection electrode CE1, the second connection electrode CE2, and the planarization layer 115. The light emitting element 170 is a component that is disposed to correspond to each of the plurality of sub-pixels SPX and emits light in a specific wavelength range. For example, the light emitting element 170 may be a blue light emitting element emitting blue light, a red light emitting element emitting red light, or a green light emitting element emitting green light, but the present disclosure is not limited thereto.

The light emitting element 170 may be configured differently depending on a type of the display device 100. When the display device 100 is an organic light emitting display device, the light emitting element 170 may be an organic light emitting element 170 including an anode, an organic light emitting layer 172 and a cathode. When the display device 100 is an inorganic light emitting display device, the light emitting element 170 may be a light emitting diode (LED) including an n-type semiconductor layer, the light emitting layer 172, and a p-type semiconductor layer, in particular, may be a micro-light emitting diode (LED). Hereinafter, it is described assuming that the light emitting element 170 is a micro-LED formed of an inorganic light emitting material, but the present disclosure is not limited thereto, and the light emitting element 170 formed of an organic light emitting material may be used.

The light emitting element 170 includes a first semiconductor layer 171, the light emitting layer 172, a second semiconductor layer 173, a first electrode 174, and a second electrode 175. Hereinafter, for convenience of explanation, although it is described assuming that the light emitting element 170 is a micro-LED having a flip chip structure, the light emitting element 170 may be a micro-LED having a lateral structure or a vertical structure, but the present disclosure is not limited thereto.

The first electrode 174 is disposed on the first connection electrode CE1, and the second electrode 175 is disposed on the second connection electrode CE2. The first electrode 174 and the second electrode 175 are electrically connected to the first connection electrode CE1 and the second connection electrode CE2, respectively. The first electrode 174 may transfer a voltage from the drain electrode 154 of the transistor 150 to the first semiconductor layer 171, and the second electrode 175 may transmit a voltage from the power pad 192 to the second semiconductor layer 173.

Meanwhile, a plurality of connection patterns BP are disposed between the first connection electrode CE1 and the second connection electrode CE2 and the light emitting element 170. The plurality of connection patterns BP are mediums for bonding each of the plurality of light emitting elements 170 and the first connection electrode CE1 and the second connection electrode CE2. For example, the plurality of connection patterns BP may be gold (Au) bumps or solder bumps, but the present disclosure is not limited thereto.

The plurality of connection patterns BP includes a first connection pattern BP1 and a second connection pattern BP2. The first connection pattern BP1 is disposed between the first connection electrode CE1 and the first electrode 174, and the second connection pattern BP2 is disposed between the second connection electrode CE2 and the second electrode 175. Each of the plurality of light emitting elements 170 may be bonded onto the pixel substrate 111A by means of the plurality of connection patterns BP disposed between the first electrode 174 and the first connection electrode CE1 and between the second electrode 175 and the second connection electrode CE2. In addition, among the plurality of connection patterns BP, the second connection pattern BP2 disposed between the second electrode 175 and the second connection electrode CE2 may compensate for a step difference between the second electrode 175 of the light emitting element 170 and the second connection electrode CE2.

The first semiconductor layer 171 is disposed on the first electrode 174, and the second semiconductor layer 173 is disposed on the first semiconductor layer 171. The first semiconductor layer 171 and the second semiconductor layer 173 may be formed by implanting n-type or p-type impurities into gallium nitride (GaN). For example, the first semiconductor layer 171 is a p-type semiconductor layer formed by implanting p-type impurities into gallium nitride, and the second semiconductor layer 173 is an n-type semiconductor layer formed by implanting n-type impurities into gallium nitride, but the present disclosure is not limited thereto. And, the p-type impurity may be magnesium (Mg), zinc (Zn), beryllium (Be), or the like and the n-type impurity may be silicon (Si), germanium (Ge), tin (Sn), or the like. However, the present disclosure is not limited thereto.

The light emitting layer 172 is disposed between the first semiconductor layer 171 and the second semiconductor layer 173. The light emitting layer 172 may receive holes and electrons from the first semiconductor layer 171 and the second semiconductor layer 173 and emit light. The light emitting layer 172 may have a single layer or a multi-quantum well (MQW) structure. For example, the light emitting layer 172 may be formed of indium gallium nitride (InGaN) or gallium nitride (GaN), but the present disclosure is not limited thereto.

Referring to FIGS. 4a and 5, the upper substrate US is disposed on the light emitting element 170 and the lower substrate 110.

The upper substrate US is a substrate for supporting various components disposed under the upper substrate US. Specifically, the upper substrate US is formed by coating a material for constituting the upper substrate US on the lower substrate 110 and the pixel substrate 111A and then performing curing thereon, and may be disposed to be in contact with the lower substrate 110, the pixel substrate 111A, the connection member 120, and the connection line 180.

The upper substrate US is a flexible substrate and may be formed of an insulating material that can be bent or stretched. The upper substrate US is a flexible substrate and may reversibly expand and contract. Also, the upper substrate US may have an elastic modulus of several MPa to several hundred MPa, and a ductile breaking rate of the upper substrate US may be 100% or more. The thickness of the upper substrate US may be 10 μm to 1 mm, but the present disclosure is not limited thereto.

The upper substrate US may be formed of the same material as the lower substrate 110. For example, the upper substrate US may be formed of an elastomer, for example, silicone rubber such as polydimethylsiloxane (PDMS), polyurethane (PU), or polytetrafluoroethylene (PTFE) and thus, may have flexible properties. However, the material of the upper substrate US is not limited thereto.

Meanwhile, although not illustrated in FIGS. 4a and 5, a polarization layer may be disposed on the upper substrate US. The polarization layer may polarize light incident from the outside of the display device 100 and reduce external light reflection. In addition, an optical film other than the polarization layer may be disposed on the upper substrate US.

Hereinafter, the touch unit TU will be described in more detail with reference to FIGS. 6a and 6b. The display device according to another embodiment of the present disclosure has a difference in that the touch bridge line of the display device according to an embodiment of the present disclosure is separated into a first touch bridge line and a second touch bridge line, and thus, has a difference in touch electrode contact relationship. Hereinafter, a display device according to another embodiment of the present disclosure and the display device according to an embodiment of the present disclosure will be described in more detail.

Other Structures of Touch Unit

Figure 6A:
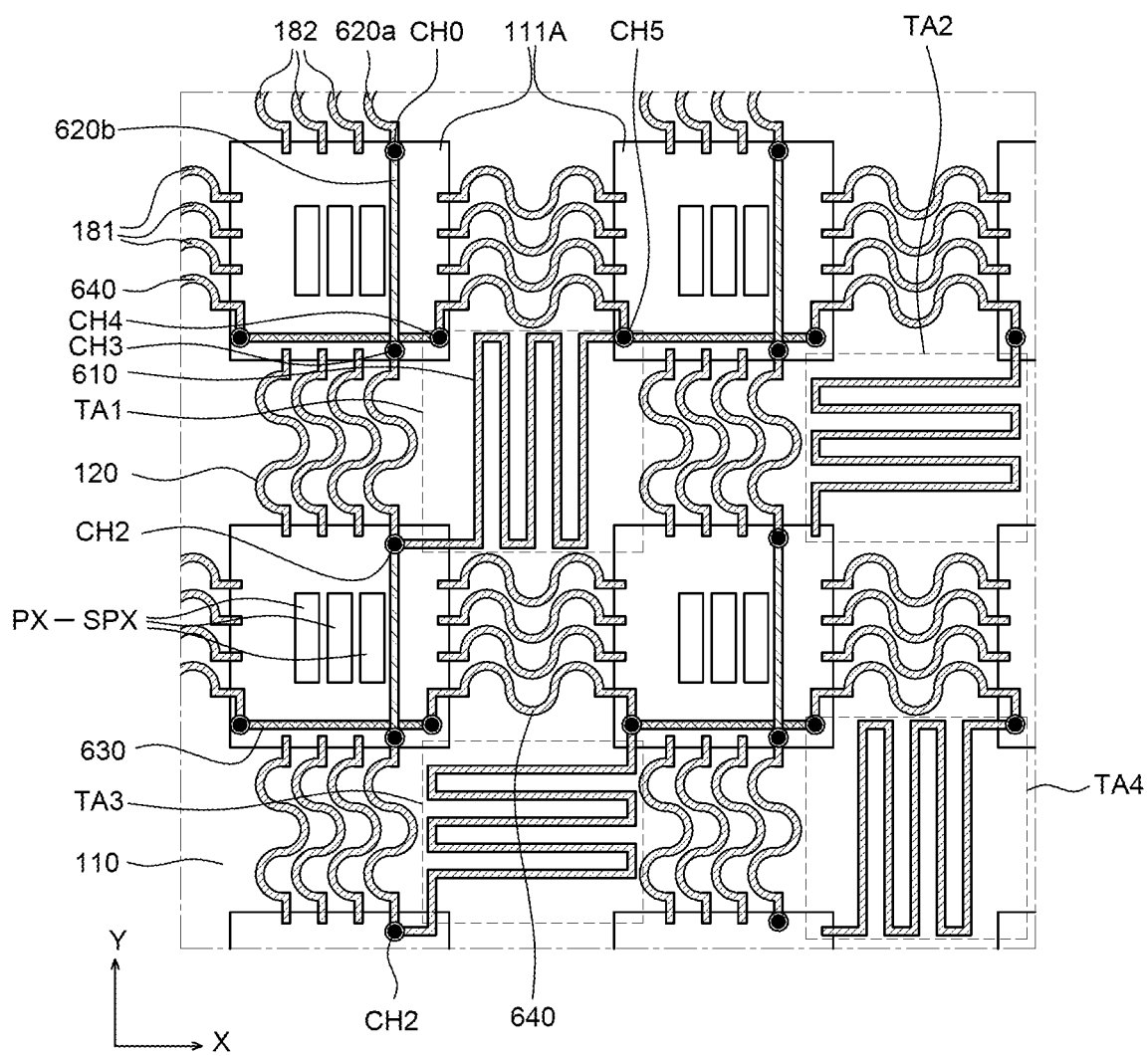
FIGS. 6a and 6b are enlarged plan views each illustrating a touch unit of a display device according to another embodiment of the present disclosure.
Figure 6B:
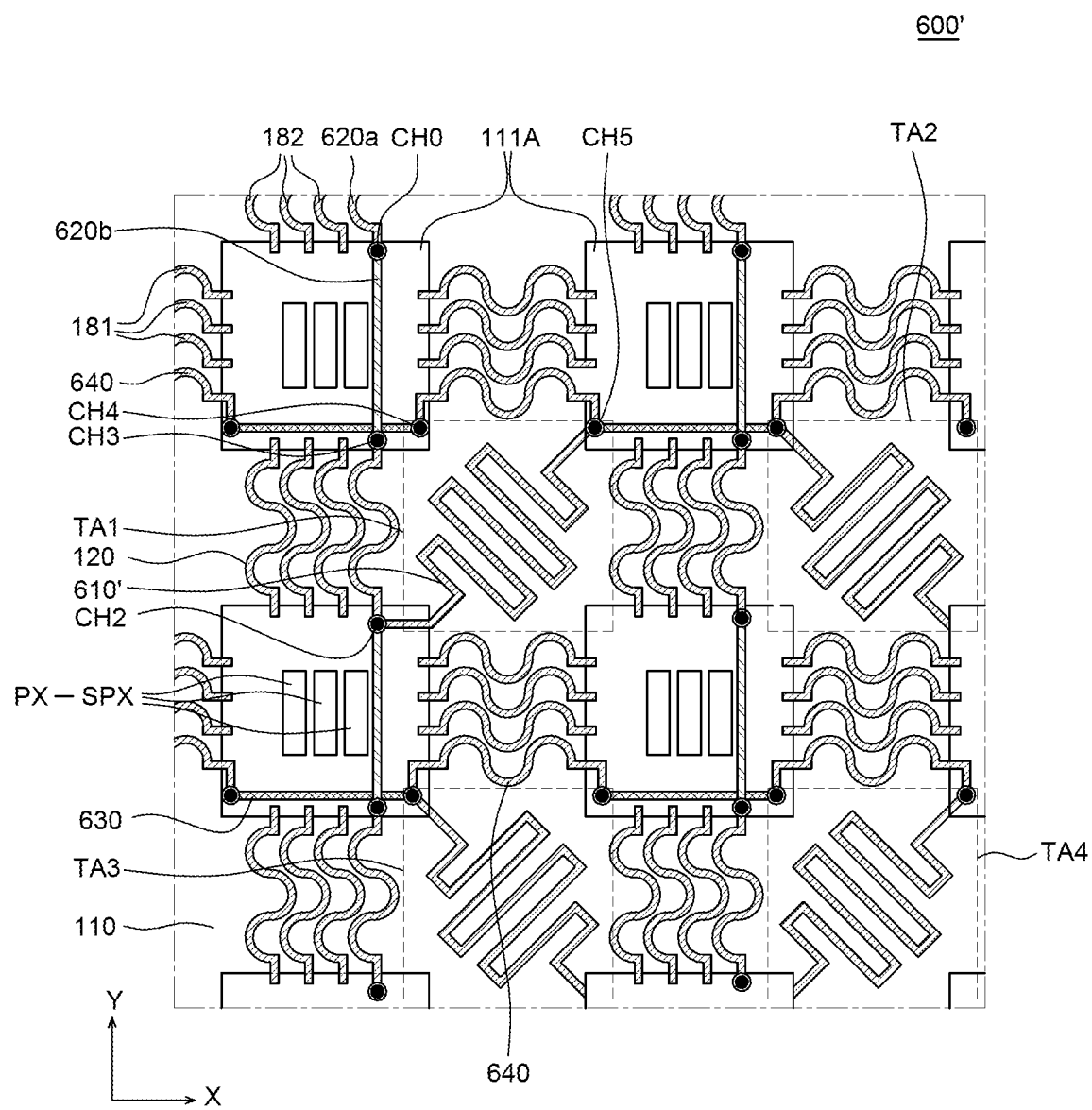

FIGS. 6a and 6b are enlarged plan views each illustrating a touch unit of a display device according to another embodiment of the present disclosure.

Referring to FIGS. 6a and 6b, display devices 600 and 600' according to another embodiments of the present disclosure includes touch electrodes 610 and 610', touch lines 620, first touch bridge lines 630, and second touch bridge lines 640. A detailed description of components of the display devices 600 and 600' illustrated in FIGS. 6a and 6b except for the touch electrodes 610 and 610', touch lines 620, first touch bridge lines 630, and second touch bridge lines 640 that are components different from those of the display device 100 illustrated in FIGS. 3 to 5, will be omitted.

The touch electrodes 610 and 610' are disposed on the connection members 120 arranged in the touch electrode areas TA present between four pixel substrates 111A disposed adjacent to each other in an X-axis direction and a Y-axis direction.

As illustrated in FIGS. 6a and 6b, an area that is located in a first column of a first row in the Y-axis direction may be referred to as a first touch electrode area TA1 and an area that is located in a second column of the first row in the Y-axis direction may be referred to as a second touch electrode area TA2. In addition, an area that is located in the first column of a second row in the Y-axis direction may be referred to as a third touch electrode area TA3, and an area that is located in the second column of the second row in the Y-axis direction may be referred to as a fourth touch electrode area TA4. The touch electrodes 610 and 610' disposed in the first touch electrode areas TA1 and the touch electrodes 610 and 610' disposed in the fourth touch electrode areas TA4 may have the same arrangement direction, and the touch electrodes 610 and 610' disposed in the second electrode area TA2 and the touch electrodes 610 and 610' disposed in the third touch electrode area TA3 may have the same arrangement direction. In addition, the arrangement direction of the touch electrodes 610 and 610' disposed in the first touch electrode area TA1 and the fourth touch electrode area TA4 is different from the arrangement direction of the touch electrodes 610 and 610' disposed in the second touch electrode area TA2 and the third touch electrode area TA3. The touch electrodes 610 and 610' disposed in the first touch electrode area TA1 and the fourth touch electrode area TA4 have a shape that is advantageous to stretching when the lower substrate 110 is stretched in the X-axis direction. The touch electrodes 610 and 610' disposed in the second touch electrode area TA2 and the third touch electrode area TA3 may have a shape advantageous to stretching when the lower substrate 110 is stretched in the Y-axis direction. Accordingly, the display devices 600 and 600' according to another embodiments of the present disclosure can implement a touch system by disposing touch electrodes 610 and 610' capable of sensing a touch in the display devices 600 and 610', and can be stretched in both the X-axis direction and the Y-axis direction. Having "a shape that is advantageous to stretching" in a direction should be understood to include having a shape that has better elasticity in the direction than in other directions. For example, the touch electrode 610 in the first touch area TA1 shown in FIG. 6A has better elasticity in the X-axis direction than in the Y-axis direction. This may be a result of the touch electrode 610 in the first touch area TA1 having less length in the X-axis direction than in the Y-axis direction. In the example shown in FIG. 6B, the touch electrode 610' in the first touch area TA1 may have a shape that is advantageous to stretching in a third direction that has an angular offset from the first direction (e.g., a 45 degree offset), and the touch electrode 610' in the second touch area TA2 may have a shape that is advantageous to stretching in a fourth direction that has an angular offset from the second direction (e.g., a 45 degree offset). The third direction may be perpendicular to the fourth direction. In one embodiment, the touch electrodes 610 may be combined with the touch electrodes 610', such that the display device 600 or 600' may have touch electrodes 610, 610' that have shapes advantageous to stretching in the first direction, the second direction, the third direction and the fourth direction.

The touch electrodes 610 and 610' may be electrically connected to the first touch bridge lines 630 disposed on the respective pixel substrates 111A. Specifically, the touch electrode 610 or 610' may be in contact with and electrically connected to the first touch bridge line 630 disposed on the pixel substrate 111A through a fifth contact hole CH5. The touch electrode 610 or 610' extends in a bent shape rather than a straight line shape in the touch electrode area TA.

As illustrated in FIGS. 6a and 6b, in the display devices 600 and 600' according to another embodiments of the present disclosure, the touch electrodes 610 and 610' having different shapes are disposed, positions of contact portions of the touch electrodes 610 and 610' and the first touch bridge lines 630 may be varied. For example, referring to FIG. 6a, the touch electrode 610 is in contact with and electrically connected to the first touch bridge line 630 disposed on the pixel substrate 111A which is positioned in the second column of the first row through the fifth contact hole CH5. In addition, the touch electrode 610 is in contact with and electrically connected to the touch line 620 disposed on the pixel substrate 111A which is positioned in the first column of the second row through a second contact hole CH2. Meanwhile, referring to FIG. 6b, the touch electrode 610' is in contact with and electrically connected to the first touch bridge line 630 disposed on the pixel substrate 111A which is positioned in the second column of the first row through the fifth contact hole CH5. In addition, the touch electrode 610' is in contact with and electrically connected to the touch line 620 disposed on the pixel substrate 111A which is positioned in the first column of the second row through the second contact hole CH2. This may differ depending on the arrangement direction of the touch electrodes 610 and 610'.

The touch lines 620 may be disposed on the plurality of pixel substrates 111A and the connection members 120. Specifically, the touch line 620 may include a first touch line 620a that is disposed on the upper surface of the connection member 120, and a second touch line 620b that is electrically connected to the first touch line 620a and disposed on an upper surface of the pixel substrate 111A. The first touch line 620a may be formed of the same material as the first connection line 181 or the second connection line 182, but is not limited thereto. In addition, the second touch line 620b may be formed of the same material as the source electrode 153 and the drain electrode 154, but is not limited thereto. As illustrated in FIG. 3, the first touch lines 620a and the second touch lines 620b may be electrically connected through a touch line contact hole CH0, the second contact hole CH2, and a third contact hole CH3. In addition, the touch line 620 may be electrically connected to the touch electrode 131 through the second contact hole CH2. For example, as illustrated in FIG. 6a, the second touch line 620b of the touch line 620 may be electrically connected to the touch electrode 131 through the second contact hole CH2.

The first touch bridge line 630 is disposed on each of the plurality of pixel substrates 111A. The first touch bridge lines 630 are disposed in the same direction as the X-axis direction on the plurality of pixel substrates 111A. That is, the first touch bridge line 630 is disposed in the same direction as the first connection line 181. Since the first touch bridge line 630 is disposed on the pixel substrate 111A, it extends in a straight line shape. The first touch bridge line 630 may be formed of the same material as the gate electrode 151 of the transistor 150, but the present disclosure is not limited thereto.

The first touch bridge line 630 is electrically connected to each of the touch electrode 610 and the second touch bridge line 640. Both sides of the first touch bridge line 630 are in contact with and electrically connected to the second touch bridge line 640 through a fourth contact hole CH4 and the fifth contact hole CH5. In addition, the first touch bridge line 630 is electrically connected to the touch electrode 610 through the fifth contact hole CH5. Accordingly, the first touch bridge line 630 is electrically connected to the touch electrode 610 and the second touch bridge line 640 to thereby form the touch unit TU.

The second touch bridge line 640 serves to electrically connect the first touch bridge line 630 disposed on the pixel substrate 111A in the X-axis direction. One side of the second touch bridge line 640 is electrically connected to the first touch bridge line 630 disposed on the pixel substrate 111A that is disposed in the first column of the first row through the fourth contact hole CH4, and, the other side of the second touch bridge line 640 is electrically connected to the first touch bridge line 630 through the fifth contact hole CH5 disposed in the pixel substrate 111A that is disposed in the second column of the first row.

The second touch bridge line 640 is disposed on one of the plurality of connection members 120 extending in the X-axis direction. That is, the second touch bridge line 640 is disposed in the same direction as the first connection line 181. The second touch bridge line 640 extends in a bent shape rather than a straight line shape. However, the shape of the second touch bridge line 640 is not limited thereto, and may have various stretchable shapes.

As described above, in the display devices 600 and 600' according to another embodiment of the present disclosure, the second touch bridge line 640 is formed on one of the plurality of connection members 120 that are in the X-axis direction, the touch line 620 is formed on one of the plurality of connection members 120 that are in the Y-axis direction, the connection member 120 and the touch electrode 610 are disposed in an area where an existing connection member 120 is not disposed, and the touch electrode 610, the touch line 620, and the second touch bridge line 640 are formed to be electrically connected to the first touch bridge line 630 disposed on the pixel substrate 111A, so that a touch system can be easily implemented in the display device 100.

Hereinafter, a display device according to another embodiment (third embodiment) of the present disclosure will be described. As compared to the display device according to an embodiment of the present disclosure, in the display device according to still another embodiment (third embodiment) of the present disclosure, the connection member 120 may be omitted from the touch electrode area TA and accordingly, an arrangement of the touch electrode is changed. Hereinafter, FIGS. 7a and 7b, which are sectional views taken along line VII-VII' illustrated in FIG. 3 will be mainly described.

Another Structure of Touch Unit

Figure 7A:
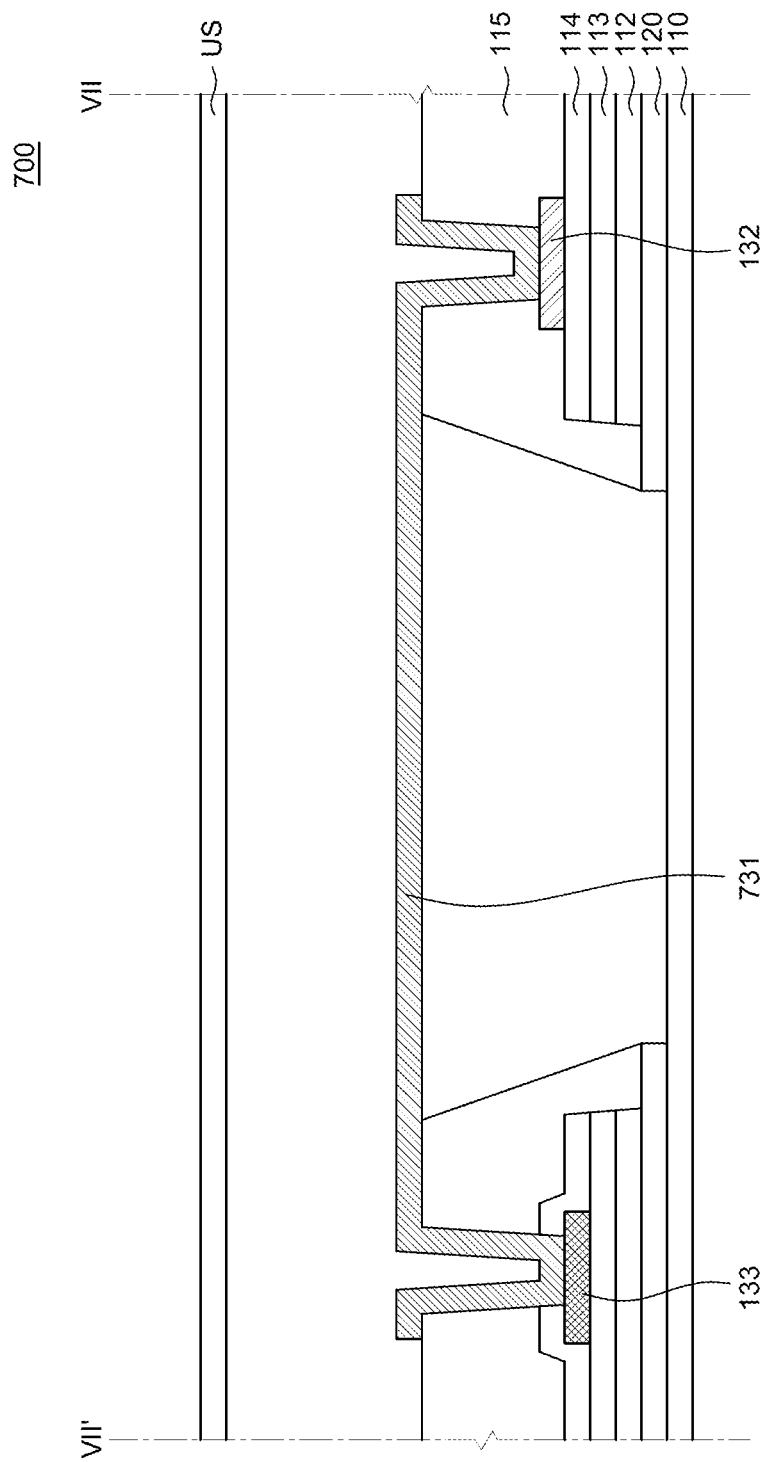
FIGS. 7a and 7b are cross-sectional views each illustrating a display device according to another embodiment of the present disclosure, and are cross-sectional views taken along line VII-VII' of FIG. 3.
Figure 7B:
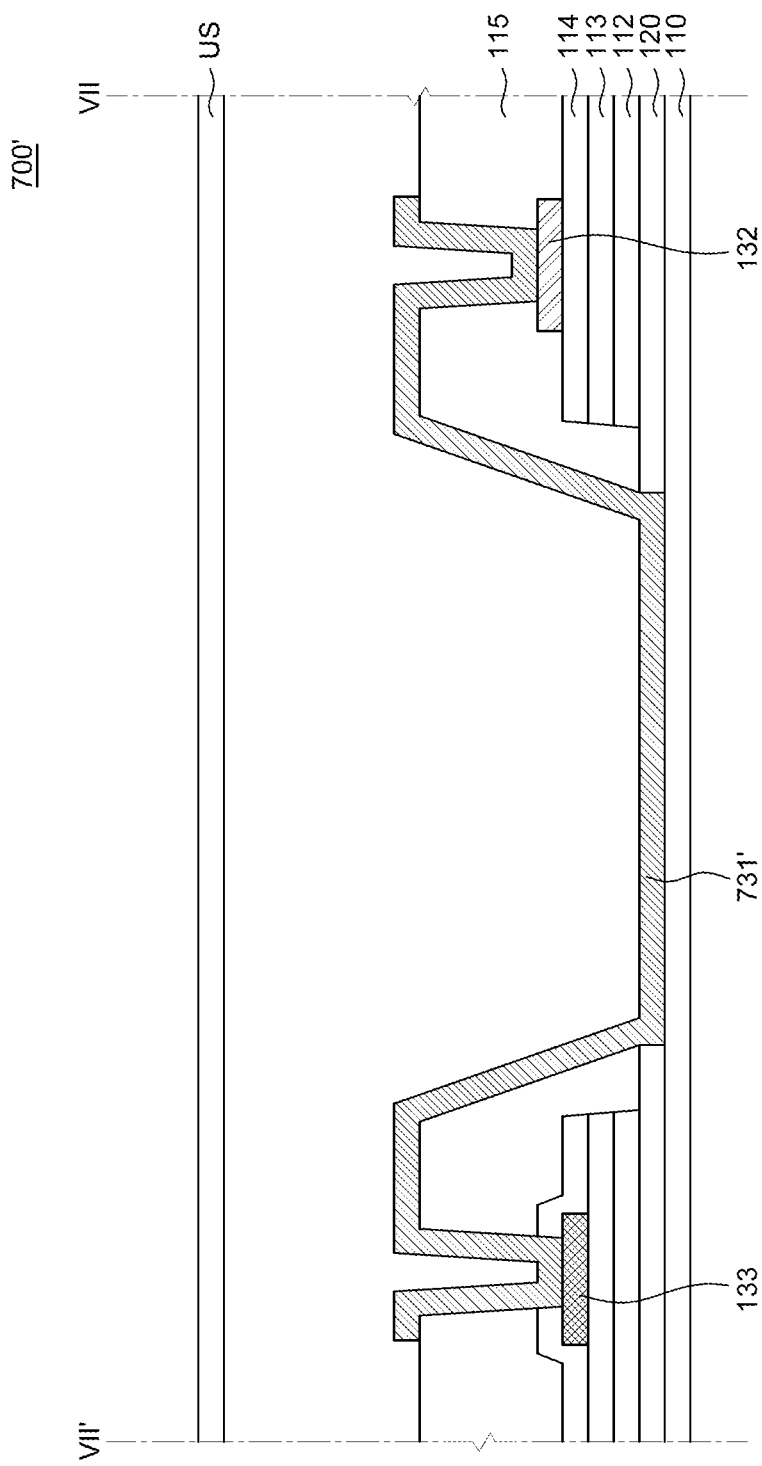

FIGS. 7a and 7b are cross-sectional views taken along line VII-VII' of FIG. 3.

An enlarged plan view of another embodiment (third embodiment) of the present disclosure, and an enlarged plan view according to an embodiment of the present disclosure are identical to each other, but cross-sectional views of another embodiment (third embodiment) of the present disclosure and an embodiment of the present disclosure are different from each other. Thus, hereinafter, a display device according to another embodiment (third embodiment) of the present disclosure will be described with reference to FIGS. 7a and 7b.

Referring to FIGS. 3 and 7a and 7b, in the display devices 700 and 700' according to another embodiment of the present disclosure, touch electrodes 731 and 731' are disposed in touch electrode areas TA present between four pixel substrates 111A that are adjacent to each other in the X-axis direction and the Y-axis direction.

In this case, in the touch electrode area TA, the touch electrode 731 or 731' is not supported by the connection member 120. That is, the connection member 120 is disposed only in the area where the existing first connection line 181 and the second connection line 182 are disposed, and the connection member 120 is not disposed in an area where the first connection line 181 and the second connection line 182 are not disposed.

That is, as illustrated in FIGS. 7a and 7b, the touch electrode 731 or 731' is disposed on the lower substrate 110. That is, the connection member 120 is not disposed on a partial area of the lower substrate 110 overlapping the touch electrode 731.

Specifically, as illustrated in FIG. 7a, the touch electrode 731 may be spaced apart from the lower substrate 110. Accordingly, a separation space may be formed between the touch electrode 731 and the lower substrate 110.

Alternatively, as illustrated in FIG. 7b, the touch electrode 731' may be in contact with the lower substrate 110. Accordingly, a separation space may not be formed between the touch electrode 731 and the lower substrate 110.

Accordingly, in the display devices 700 and 700' according to another embodiment of the present disclosure, it is unnecessary to form the connection member 120 in an area where the first connection line 181 and the second connection line 182 are not disposed, that is, in the touch electrode area TA, so that a process procedure for implementing a touch system in the display devices 700 and 700' may be further simplified.

Hereinafter, a display device according to still another embodiment (fourth embodiment) of the present disclosure will be described. The display device according to still another embodiment (fourth embodiment) of the present disclosure does not have a separate touch electrode and has a different touch driving method, compared to the display device according to an embodiment of the present disclosure. Hereinafter, differences between still another embodiment (fourth embodiment) of the present disclosure and another embodiment of the present disclosure will be mainly described.

Arrangement Structure of Touch Electrodes of Display Device

Figure 8:
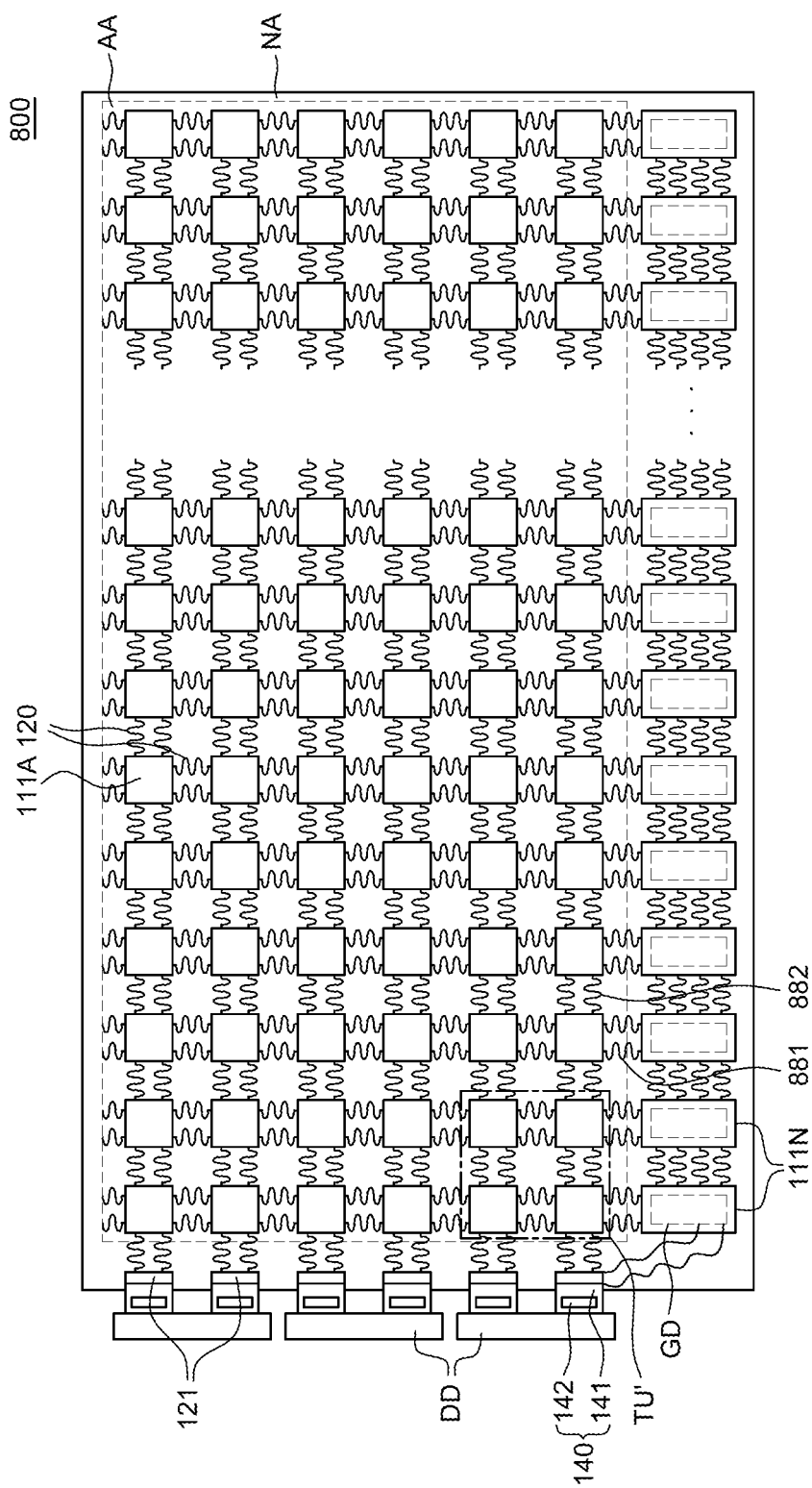
FIG. 8 is a plan view of a display device according to still another embodiment of the present disclosure.

FIG. 8 is a plan view of a display device according to still another embodiment (fourth embodiment) of the present disclosure.

Figure 9:
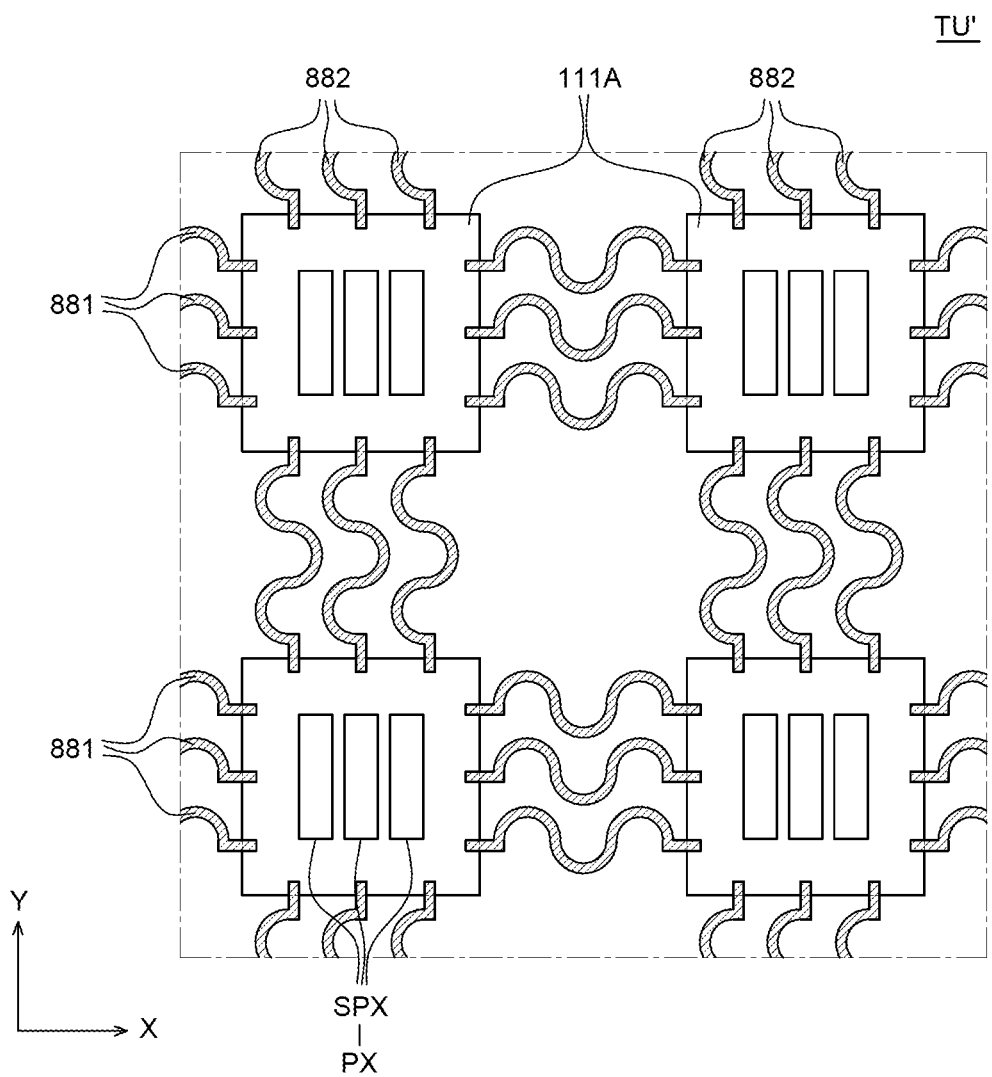
FIG. 9 is an enlarged plan view of the display device according to still another embodiment of the present disclosure.

FIG. 9 is an enlarged plan view of the display device according to still another embodiment (fourth embodiment) of the present disclosure.

Figure 10:
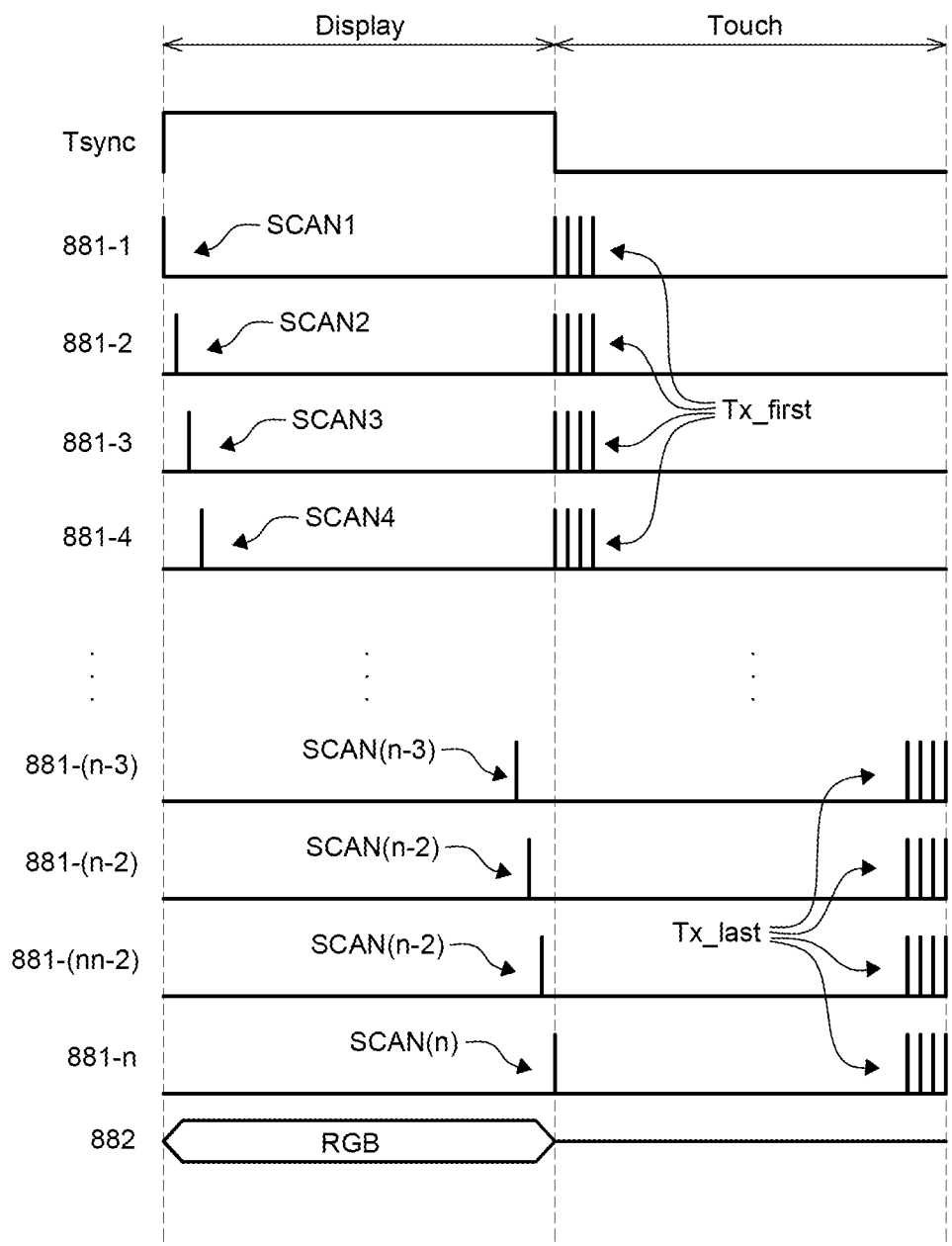
FIG. 10 is a waveform diagram illustrating a voltage applied to the display device according to still another embodiment of the present disclosure.

FIG. 10 is a waveform diagram illustrating a voltage applied to the display device according to still another embodiment (fourth embodiment) of the present disclosure.

As illustrated in FIGS. 8 and 9, each of the plurality of first connection lines 881 connects the plurality of pixel substrates 111A arranged along a first direction among the plurality of pixel substrates 111A, and each of second connection lines 882 connects the plurality of pixel substrates 111A arranged along a second direction among the plurality of pixel substrates 111A.

In a display device 800 according to still another embodiment (fourth embodiment) of the present disclosure, a separate touch electrode is not disposed. That is, in the display device 800 according to still another embodiment (fourth embodiment) of the present disclosure, the plurality of first connection lines 881 and the plurality of second connection lines 882 serve as touch electrodes.

That is, the display device 800 according to still another embodiment (fourth embodiment) of the present disclosure may be time-divisionally driven in a display period and a touch period.

In the display period, each of the plurality of first connection lines 881 may perform a function of a gate line applying a gate voltage to the plurality of pixels PX, and each of the plurality of second connection lines 882 may perform a function of a data line for applying a data voltage RGB to the plurality of pixels PX.

And, in the touch period, each of the plurality of first connection lines 881 may perform a function of a touch transmission electrode (Tx electrode) for applying a touch driving signal, and each of the plurality of second connection lines 882 may perform a function of a touch reception electrode (Rx electrode) to which a touch sensing signal is applied.

More specifically, referring to FIG. 10, in a case in which a synchronization signal Tsync is at a high level, the case corresponds to the display period. Accordingly, a scan signal is sequentially applied to each of the plurality of first connection lines 881.

For example, a first connection line 881-1 that is connected to the plurality of pixel substrates 111A in a first row outputs one pulse which is a first scan signal SCAN1. Thereafter, a first connection line 881-2 that is connected to the pixel substrates 111A in a second row outputs one pulse which is a second scan signal SCAN2. Thereafter, a first connection line 881-3 that is connected to the plurality of pixel substrates 111A in a third row outputs one pulse which is a third scan signal SCAN3. Thereafter, a first connection line 881-4 that is connected to the plurality of pixel substrates 111A in a fourth row outputs one pulse which is a fourth scan signal SCAN4. Thereafter, a first connection line 881-(n-3) that is connected to the plurality of pixel substrates 111A in a (n-3)th row outputs one pulse which is an (n-3)th scan signal SCAN(n-3). Thereafter, a first connection line 881-(n-2) that is connected to the plurality of pixel substrates 111A in a (n-2)th row outputs one pulse which is an (n-2)th scan signal SCAN(n-2). Thereafter, a first connection line 881-(n-1) that is connected to the plurality of pixel substrates 111A in a (n-1)th row outputs one pulse which is an (n-1)th scan signal SCAN(n-1). Thereafter, a first connection line 881-n that is connected to the plurality of pixel substrates 111A in an n-th row outputs one pulse which is an n-th scan signal SCAN(n).

In addition, the data voltage RGB is applied to each of the plurality of second connection lines 882 in the display period.

And, in a case in which the synchronization signal is at a low level, the case corresponds to the touch period. Accordingly, a touch driving signal is sequentially applied to a plurality of groups of the first connection lines 881.

For example, a first touch driving signal Tx_first may be applied to a first group of first connection lines, that is, the first connection line 881-1 that is connected to the plurality of pixel substrates 111A in the first row, the first connection line 881-2 that is connected to the plurality of pixel substrates 111A in the second row, the first connection line 881-3 that is connected to the plurality of pixel substrates 111A in the third row, and the first connection line 881-4 that is connected to the plurality of pixel substrates 111A in the fourth row.

The above-described first touch driving signal Tx_first may be the sum of the first scan signal SCAN1, the second scan signal SCAN2, the third scan signal SCAN3, and the fourth scan signal SCAN4 described above.

In addition, a last touch driving signal Tx_last may be applied to a last group of first connection lines, that is, the first connection line 881-(n-3) that is connected to the plurality of pixel substrates 111A in the (n-3)th row, the first connection line 881-(n-2) that is connected to the plurality of pixel substrates 111A in the (n-2)th row, the first connection line 881-(n-1) that is connected to the plurality of pixel substrates 111A in the (n-1)th row, and the first connection line 881-n that is connected to the plurality of pixel substrates 111A in the n-th row.

The above-described last touch driving signal Tx_last may be the sum of the (n-3)th scan signal SCAN(n-3), the (n-2)th scan signal SCAN(n-2), the (n-1)th scan signal SCAN(n-1), and the n-th scan signal SCAN(n).

A reference voltage may be applied to each of the plurality of second connection lines 882 in the display period, and through this, a touch sensing signal may be detected.

Through the time division driving described above, in the display device (fourth embodiment) according to still another embodiment of the present disclosure, mutual capacitance formed between the first connection line 881 and the second connection line 882 can be detected by the touch sensing signal. Accordingly, in the display device (fourth embodiment) according to still another embodiment of the present disclosure, a touch by a finger or a pen can be sensed with mutual capacitance in the touch period, and the plurality of pixels may can emit light to implement an image in the display period.

Arrangement Structure of Touch Electrodes of Display Device

Figure 11:
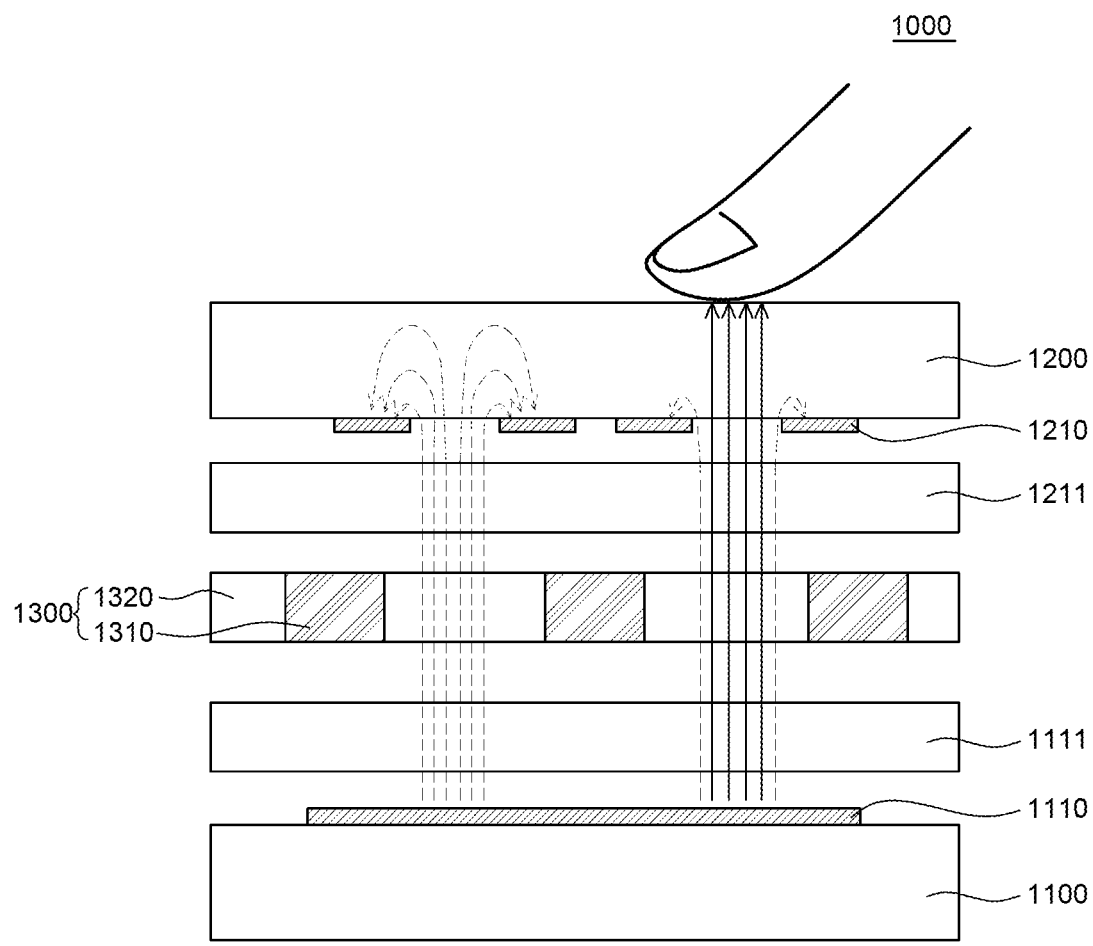
FIG. 11 is a schematic cross-sectional view of a display device according to yet another embodiment of the present disclosure.

FIG. 11 is a schematic cross-sectional view of a display device according to yet another embodiment (fifth embodiment) of the present disclosure.

Referring to FIG. 11, a display device 1000 according to still another embodiment (fifth embodiment) of the present disclosure includes a lower substrate 1100, an upper substrate 1200, and a middle substrate 1300.

In general, the lower substrate may be called first substrate. The middle substrate may be called second substrate. The upper substrate may be called third substrate.

The lower substrate 1100 is a substrate for supporting and protecting various components of the display device 1000. The lower substrate 1100 may be a flexible substrate and may be formed of an insulating material that can be bent or stretched. A first touch electrode 1110 is disposed on an upper surface of the lower substrate 1100. The first touch electrode 1110 is disposed in any one of an X-axis direction and a Y-axis direction. The first touch electrode 1110 may be a touch transmission electrode (Tx electrode).

The upper substrate 1200 is disposed above the lower substrate 1100 and serves to cover and protect various components of the display device 1000. A plurality of second touch electrodes 1210 corresponding to the first touch electrode 1110 are disposed on a lower surface of the upper substrate 1200, that is, on a surface of the upper substrate 1200, facing the lower substrate 1100. The plurality of second touch electrodes 1210 may be formed of a transparent conductive material. The second touch electrode 1210 may be a touch reception electrode (Rx electrode).

The middle substrate 1300 is a substrate on which various components of the display device 1000 are disposed. The middle substrate 1300 may include first areas 1310 having pixel substrates in which pixels and driving elements for driving the pixels are disposed, and second areas 1320 in which the pixel substrates are not disposed. A plurality of the pixel substrates are independently disposed on the lower substrate 1100 to be spaced apart from each other, and the areas where the pixel substrates are disposed are the first areas 1310, and spaced areas between the pixel substrates are the second areas 1320. The pixel substrate may be rigid compared to the lower substrate 1100. That is, the lower substrate 1100 may have more flexible characteristics compared to the pixel substrate, and the pixel substrate may have more rigid characteristics compared to the lower substrate 1100.

In FIG. 11, the middle substrate 1300 may be in a state in which all of components except for the lower substrate 110, the touch electrode 131, and the first touch bridge line 133 are disposed in the same manner as the case of FIG. 1. As described above, the middle substrate 1300 is bonded to the lower substrate 1100 through a first adhesive layer 1111, and is bonded to the upper substrate 1200 through a second adhesive layer 1211.

The first touch electrode 1110 may be disposed on an entire surface of the lower substrate 1100, regardless of the first area 1310 and the second area 1320 of the middle substrate 1300. Meanwhile, the second touch electrode 1210 may be disposed to correspond to the first area 1310 of the middle substrate 1300. As described above, in the display device 1000 according to yet another embodiment of the present disclosure, the first touch electrode 1110 is disposed on the upper surface of the lower substrate 1100, and the second touch electrode 1210 is disposed on the surface of the upper substrate 1200 facing the lower substrate 1100, so that a touch by a finger, a pen, or the like may be sensed with a peripheral capacitance formed between the first touch electrode 1110 and the second touch electrode 1210.

The embodiments of the present disclosure can also be described as follows:

A display device according to an embodiment of the present disclosure may include a lower substrate; a plurality of pixel substrates disposed on the lower substrate to be spaced apart from each other along a first direction and a second direction perpendicular to the first direction; first connection lines disposed between first pixel substrates of the plurality of pixel substrates, the first pixel substrates being disposed along the first direction; second connection lines disposed between second pixel substrates of the plurality of pixel substrates, the second pixel substrates being disposed along the second direction; and a touch electrode disposed in an area adjacent to areas in which the first connection lines and the second connection lines are disposed among spaces between the plurality of pixel substrates.

An arrangement direction of the touch electrode disposed in a first area adjacent to the respective areas in which the first connection lines and the second connection lines are disposed among areas between the plurality of pixel substrates may be different from an arrangement direction of the touch electrode disposed in a second area adjacent to the first area along the first direction and the touch electrode disposed in a third area adjacent to the first area along the second direction.

The arrangement direction of the touch electrode disposed in the first area adjacent to the respective areas in which the first connection lines and the second connection lines are disposed among areas between the plurality of pixel substrates may be identical to an arrangement direction of the touch electrode disposed in a fourth area that is adjacent to the second area along the second direction and adjacent to the third area along the first direction.

The display device may further comprise a touch bridge line disposed on each of the plurality of pixel substrates. A touch line may be disposed along the second direction in an area between the plurality of pixel substrates.

Each of the touch bridge line and the touch line may be electrically connected to the touch electrode.

The touch electrode may be in contact with the touch line or the touch bridge line in each of the plurality of pixel substrates.

The touch electrode, the touch bridge line, and the touch line may form one touch unit.

A light emitting element and driving elements for driving the light emitting element may be disposed on each of the plurality of pixel substrates.

The touch electrode and the touch bridge line may be formed in forming the driving element.

The touch line may be formed in forming the second connection line.

The display device may further comprise a first touch bridge line disposed along the first direction in each of the plurality of pixel substrates, a touch line disposed along the second direction in an area between the plurality of pixel substrates and a second touch bridge line disposed along the first direction in the area between the plurality of pixel substrates.

The first touch bridge line may be electrically connected to the touch electrode, the second touch bridge line, and the touch line.

The touch electrode, the first touch bridge line, the touch line, and the second touch bridge line may form one touch unit.

A support member for supporting the touch electrode may be disposed in an area adjacent to the respective areas in which the first connection lines and the second connection lines are disposed among areas between the plurality of pixel substrates.

The touch electrode may be disposed on the lower substrate.

A data voltage may be applied to each of the plurality of second connection lines in the display period.

A touch sensing signal may be applied to each of the plurality of second connection lines in the touch period.

A display device according to another embodiment of the present disclosure may include a lower substrate on which a first touch electrode is disposed; a middle substrate on which first areas having a plurality of pixel substrates in which light emitting elements and driving elements for driving the light emitting elements are disposed, and second areas between the plurality of pixel substrates are defined; and an upper substrate having a plurality of second touch electrodes disposed on a surface thereof facing the lower substrate.

The plurality of second touch electrodes may be disposed to correspond to the first areas of the middle substrate.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a lower substrate;
   a plurality of pixel substrates disposed on the lower substrate to be spaced apart from each other along a first direction and a second direction perpendicular to the first direction;
   first connection lines disposed between first neighboring pixel substrates of the plurality of pixel substrates, the first neighboring pixel substrates being disposed along the first direction;
   second connection lines disposed between second neighboring pixel substrates of the plurality of pixel substrates, the second neighboring pixel substrates being disposed along the second direction;
   a touch electrode disposed in an area adjacent to areas in which the first connection lines and the second connection lines are disposed, the area being among spaces between the plurality of pixel substrates;
   a touch bridge line disposed on each of the plurality of pixel substrates; and
   a touch line disposed along the second direction in an area between the plurality of pixel substrates,
   wherein each of the touch bridge line and the touch line is electrically connected to the touch electrode.

2. The display device of claim 1, wherein the touch electrode is in contact with the touch line or the touch bridge line in each of the plurality of pixel substrates.

3. The display device of claim 2, wherein the touch electrode, the touch bridge line, and the touch line form one touch unit.

4. The display device of claim 1, wherein a light emitting element and driving elements for driving the light emitting element are disposed on each of the plurality of pixel substrates,
   wherein the touch electrode and the touch bridge line are formed in forming the driving element, and
   the touch line is formed in forming the second connection lines.

5. The display device of claim 1, further comprising:
   a second touch bridge line disposed along the first direction in the area between the plurality of pixel substrates;
   wherein the touch bridge line is disposed along the first direction.

6. The display device of claim 5, wherein the touch bridge line is electrically connected to the touch electrode, the second touch bridge line, and the touch line.

7. The display device of claim 6, wherein the touch electrode, the touch bridge line, the touch line, and the second touch bridge line form one touch unit.

8. The display device of claim 1, wherein the touch electrode is disposed on the lower substrate.

9. The display device of claim 1, further comprising:
   a first touch electrode in a first area, the first area being between the plurality of pixel substrates;
   a second touch electrode in a second area, the second area being adjacent the first area along the first direction;
   a third touch electrode in a third area, the third area being adjacent the first area along the second direction; and
   a fourth touch electrode in a fourth area, the fourth area being adjacent the second area and the third area, the fourth area being separated from the first area by one of the plurality of pixel substrates;
   wherein the first touch electrode and the third touch electrode have a first arrangement;
   wherein the second touch electrode and fourth touch electrode have a second arrangement, the second arrangement being different from the first arrangement.

10. The display device of claim 1, further comprising:
   a first touch electrode in a first area, the first area being between the plurality of pixel substrates;
   a second touch electrode in a second area, the second area being adjacent the first area along the first direction;
   a third touch electrode in a third area, the third area being adjacent the first area along the second direction; and
   a fourth touch electrode in a fourth area, the fourth area being adjacent the second area and the third area, the fourth area being separated from the first area by one of the plurality of pixel substrates;
   wherein the first touch electrode has a first shape advantageous to stretching in the first direction, the second touch electrode has a second shape advantageous to stretching in the second direction, the third touch electrode has a third shape advantageous to stretching in a third direction, and the fourth touch electrode has a fourth shape advantageous to stretching in a fourth direction;
   wherein the third direction is offset from the first direction by about 45 degrees, and the fourth direction is offset from the second direction by about 45 degrees.

11. A The display device comprising:
a lower substrate;
a plurality of pixel substrates disposed on the lower substrate to be spaced apart from each other along a first direction and a second direction perpendicular to the first direction;
first connection lines disposed between first neighboring pixel substrates of the plurality of pixel substrates, the first neighboring pixel substrates being disposed along the first direction;
second connection lines disposed between second neighboring pixel substrates of the plurality of pixel substrates, the second neighboring pixel substrates being disposed along the second direction; and
a touch electrode disposed in an area adjacent to areas in which the first connection lines and the second connection lines are disposed, the area being among spaces between the plurality of pixel substrates,
wherein an arrangement direction of a first touch electrode disposed in a first area adjacent to the respective areas in which the first connection lines and the second connection lines are disposed among areas between the plurality of pixel substrates is different from an arrangement direction of a second touch electrode disposed in a second area adjacent to the first area along the first direction and a third touch electrode disposed in a third area adjacent to the first area along the second direction.

12. The display device of claim 11, wherein the arrangement direction of the first touch electrode disposed in the first area adjacent to the respective areas in which the first connection lines and the second connection lines are disposed among areas between the plurality of pixel substrates is identical to an arrangement direction of a fourth touch electrode disposed in a fourth area that is adjacent to the second area along the second direction and adjacent to the third area along the first direction.

13. A display device comprising:
a lower substrate;
a plurality of pixel substrates disposed on the lower substrate to be spaced apart from each other along a first direction and a second direction perpendicular to the first direction;
first connection lines disposed between first neighboring pixel substrates of the plurality of pixel substrates, the first neighboring pixel substrates being disposed along the first direction;
second connection lines disposed between second neighboring pixel substrates of the plurality of pixel substrates, the second neighboring pixel substrates being disposed along the second direction; and
a touch electrode disposed in an area adjacent to areas in which the first connection lines and the second connection lines are disposed, the area being among spaces between the plurality of pixel substrates,
wherein a support member for supporting the touch electrode is disposed in an area adjacent to the respective areas in which the first connection lines and the second connection lines are disposed among areas between the plurality of pixel substrates.

14. A display device, comprising:
a lower substrate;
a plurality of pixel substrates disposed in a matrix form on the lower substrate;
a plurality of first connection lines connecting first pixel substrates among the plurality of pixel substrates, the first pixel substrates being arranged along a first direction; and
a plurality of second connection lines for connecting second pixel substrates among the plurality of pixel substrates, the second pixel substrates being arranged along a second direction,
wherein a scan signal is sequentially applied to each of the plurality of first connection lines in a display period,
wherein a touch driving signal is sequentially applied to a group of the plurality of first connection lines in a touch period,
wherein the touch driving signal is a signal obtained by a sum of a plurality of scan signals.

15. The display device of claim 14, wherein a data voltage is applied to each of the plurality of second connection lines in the display period, wherein a touch sensing signal is applied to each of the plurality of second connection lines in the touch period.

16. The display device of claim 14, further comprising:
first touch electrodes, each of the first touch electrodes being disposed in a respective first area between the plurality of pixel substrates; and
second touch electrodes, each of the second touch electrodes being disposed in a respective second area between the plurality of pixel substrates;
wherein the first touch electrodes have a first shape, the first shape being configured to stretch in a third direction;
wherein the second touch electrodes have a second shape, the second shape being configured to stretch in a fourth direction, the fourth direction being perpendicular to the third direction.

17. The display device of claim 16, wherein the third direction is offset from the first direction by about 45 degrees, and the fourth direction is offset from the second direction by about 45 degrees.

18. A display device, comprising:
a lower substrate having a first touch electrode disposed thereon;
a middle substrate having:
first areas having a plurality of pixel substrates, each of the pixel substrates having:
light emitting elements disposed thereon; and
driving elements disposed thereon, the driving elements being for driving the light emitting elements; and
second areas disposed between the plurality of pixel substrates; and
an upper substrate having a plurality of second touch electrodes disposed on a surface thereof, the surface facing the lower substrate.

19. The display device of claim 18, wherein the plurality of second touch electrodes are disposed to correspond to the first areas of the middle substrate.

* * * * *

UNITED STATES PATENT AND TRADEMARK OFFICE
CERTIFICATE OF CORRECTION

PATENT NO. : 11,714,504 B2
APPLICATION NO. : 17/561270
DATED : August 1, 2023
INVENTOR(S) : CheolSe Kim et al.

It is certified that error appears in the above-identified patent and that said Letters Patent is hereby corrected as shown below:

In the Claims

Column 31, Claim 11, Line 1:
"A The display device comprising:" should read: --A display device comprising:"--.

Signed and Sealed this
Fourth Day of June, 2024

Katherine Kelly Vidal
*Director of the United States Patent and Trademark Office*